(12) United States Patent
Hu et al.

(10) Patent No.: US 10,947,364 B2
(45) Date of Patent: Mar. 16, 2021

(54) FLAME RETARDANT COMPOUND, METHOD OF PREPARING THE SAME AND USE THEREOF

(71) Applicant: Elite Electronic Material (Zhongshan) Co., Ltd., Zhongshan (CN)

(72) Inventors: Zhilong Hu, Zhongshan (CN); Licheng Lin, Zhongshan (CN)

(73) Assignee: ELITE ELECTRONIC MATERIAL (ZHONGSHAN) CO., LTD., Zhongshan (CN)

( * ) Notice: Subject to any disclaimer, the term of this patent is extended or adjusted under 35 U.S.C. 154(b) by 271 days.

(21) Appl. No.: 15/832,083

(22) Filed: Dec. 5, 2017

(65) Prior Publication Data

US 2019/0085150 A1 Mar. 21, 2019

(30) Foreign Application Priority Data

Sep. 18, 2017 (CN) .......................... 201710841579.8

(51) Int. Cl.
| | | |
|---|---|---|
| *C08K 5/00* | (2006.01) | |
| *C08K 5/5313* | (2006.01) | |
| *C08K 5/5357* | (2006.01) | |
| *C07F 9/40* | (2006.01) | |
| *C07F 9/30* | (2006.01) | |
| *C07F 9/53* | (2006.01) | |
| *C07F 9/6571* | (2006.01) | |

(Continued)

(52) U.S. Cl.
CPC ............ *C08K 5/0066* (2013.01); *C07F 9/304* (2013.01); *C07F 9/4025* (2013.01); *C07F 9/4034* (2013.01); *C07F 9/5329* (2013.01); *C07F 9/657181* (2013.01); *C08K 5/5313* (2013.01); *C08K 5/5357* (2013.01); *G01N 25/4866* (2013.01); *G01N 2021/3595* (2013.01); *G01R 33/46* (2013.01)

(58) Field of Classification Search
None
See application file for complete search history.

(56) References Cited

U.S. PATENT DOCUMENTS

| | | |
|---|---|---|
| 3,029,271 A | 4/1962 | Birum et al. |
| 3,183,256 A | 5/1965 | Birum |

(Continued)

OTHER PUBLICATIONS

Valerie Gagnard et al., "Convenient Synthesis of Bisphosphonomethylphosphoric Acid, Heteroatom Chemistry", Nov. 2, 2003, pp. 111-113, vol. 14, Montpellier Cedex 5 France.

(Continued)

*Primary Examiner* — Joseph D Anthony
(74) *Attorney, Agent, or Firm* — Muncy, Geissler, Olds & Lowe, P.C.

(57) ABSTRACT

Disclosed is a phosphorus-containing compound capable of serving as a flame retardant to be used in conjunction with other ingredients to make resin compositions, useful for fabricating such as a prepreg, a resin film, a resin film with copper foil, a laminate or a printed circuit board, having improved one or more properties including glass transition temperature, coefficient of thermal expansion, thermal resistance, flame retardancy, dielectric constant, and dissipation factor. In addition, a method of preparing the phosphorus-containing compound and a resin composition comprising the phosphorus-containing compound are also disclosed.

11 Claims, 4 Drawing Sheets

(51) Int. Cl.
    *G01N 21/35*     (2014.01)
    *G01N 25/48*     (2006.01)
    *G01R 33/46*     (2006.01)

(56) References Cited

U.S. PATENT DOCUMENTS

| | | | | |
|---|---|---|---|---|
| 4,668,762 | A * | 5/1987 | Ogata | C08G 18/168 |
| | | | | 528/141 |
| 5,312,890 | A * | 5/1994 | Davis | C08G 64/083 |
| | | | | 528/167 |
| 5,414,134 | A * | 5/1995 | Davis | C07F 9/5329 |
| | | | | 568/16 |
| 2020/0048410 | A1 * | 2/2020 | Calveras | C08G 64/083 |

OTHER PUBLICATIONS

Charles E. McKenna, et al., "Synthetic Approaches to Biologically Active Bisphosphonates and Phosphonocarboxylates, Phosphorus, Sulfur, and Silicon and the Related Elements", 1999, pp. 313-316, vol. 144-146, Gordon and Breach Science Publisher, Malaysia.

S. Masson et al.,"The Reaction Between Thiophosgene and Trialkyl Phosphites", Phosphorus and Sulfur and the Related Elements, 1988, pp. 1-8, vol. 40, Gordon and Breach Science Publishers, Inc., United Kingdom.

* cited by examiner

A: formula (IV)  B: TCPO  C: THCPO  D: SPB-100  E: PX-200

FLAME RETARDANT COMPOUND, METHOD OF PREPARING THE SAME AND USE THEREOF

CROSS-REFERENCE TO RELATED APPLICATION

This application claims the priority benefit of China Patent Application No. 201710841579.8, filed on Sep. 18, 2017, the entirety of which is hereby incorporated by reference and made a part of this specification.

BACKGROUND

1. Field of the Disclosure

The present disclosure relates to a compound, a method of preparing the same, a resin composition and an article made therefrom, more particularly to a compound, a method of preparing the same and a use thereof for making a prepreg, a resin film, a resin film with copper foil, a laminate (e.g., copper-clad laminate) and a printed circuit board.

2. Description of Related Art

Printed circuit boards are widely used in numerous applications, including for example industrial mainframe computers, communication apparatuses, electrical measurement devices, defense and aviation products and household electrical appliances, all of which need a printed circuit board to serve as the base for supporting various electronic components. With the advancement of technology, electronic products are developed rapidly toward the trend of miniaturization, multiple functions, high performance and high reliability. Therefore, the development of printed circuit boards is also directed to high precision, high density, high performance, fine hole formation, thin type and multiple layers.

When surface components, such as active components or passive components, are mounted on a printed circuit board, a reflow process is carried out to melt a lead-free solder and connect the surface components to the metal traces on the printed circuit board. Deformation may occur due to the difference in coefficient of thermal expansion after the resin material for making the insulation layers of the printed circuit board has been subject to thermal shock in the reflow process; therefore, the board may be warped and deformed and have lowered flatness, causing subsequent poor soldering, such as non-wetting and other problems. High density interconnection in printed circuit boards causes increased heat generation, so there is need to provide a solution for reducing the coefficient of thermal expansion of insulation layers and increasing dimensional stability.

On the other hand, when using an epoxy resin composition to prepare a printed circuit board, in order to promote flame retardancy of the material, various flame retardants are generally added to the composition, such as halogen-containing flame retardants or phosphorus-containing flame retardants. Halogen-containing flame retardants has been prohibited or limited due to environmental issue. In addition, phosphazene compounds, such as SPB-100 commercially available from Otsuka Chemical Co. Ltd., or condensed phosphate esters, such as PX-200 commercially available from Daihachi Chemical Industry Co. Ltd., have disadvantages such as low melting point, low thermal decomposition temperature, and ionization at high temperature, so the boards made therefrom have higher coefficient of thermal expansion and tend to cause cracking of internal layers during fabrication of circuit boards and therefore lower the yield. Therefore, there is a need to develop a novel flame retardant to address the aforesaid issues.

SUMMARY

In view of the foregoing disadvantages, particularly the unsatisfactory coefficient of thermal expansion and flame retardancy of conventional materials, the present disclosure provides a compound useful in a resin composition to make articles such as prepregs or resin films for further application in fabricating copper-clad laminates or printed circuit boards, thereby improving one or more properties of the copper-clad laminates or printed circuit boards such as glass transition temperature, coefficient of thermal expansion, thermal resistance, flame retardancy, dielectric constant, and dissipation factor.

In one embodiment, the compound of the present disclosure has a structure represented by the following formula (I):

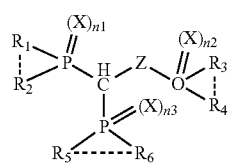

(I)

wherein n1, n2 and n3 are each individually 0 or 1; X and Z are each individually oxygen or sulfur; dotted line represents presence or absence of a bond (e.g., covalent bond); and $R_1$, $R_2$, $R_3$, $R_4$, $R_5$ and $R_6$ are each individually alkyl, aryl, alkoxy, aryloxy, sulfur-containing alkyl, sulfur-containing aryl, silyl, or siloxanyl.

In one embodiment, the compound of the present disclosure is represented by the following formula (II):

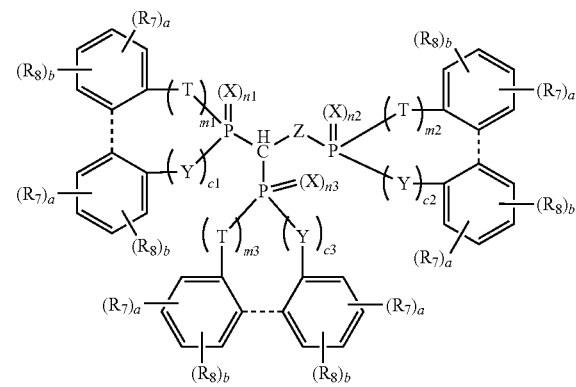

(II)

wherein n1, n2, n3, m1, m2, m3, c1, c2 and c3 are each individually 0 or 1; X, Y, Z and T are each individually oxygen or sulfur; dotted line represents presence or absence of a bond, and when the dotted line represents presence of a bond, m1 and c1 are not both 1 at the same time, m2 and c2 are not both 1 at the same time, or m3 and c3 are not both 1 at the same time; $R_7$ and $R_8$ are each individually hydrogen, alkyl, aryl, alkoxy, aryloxy, sulfur-containing alkyl, sulfur-containing aryl, silyl, or siloxanyl; and a and b are each individually an integer of 1 to 3, and a+b≤5.

In one embodiment, the compound of the present disclosure is represented by the following formula (III):

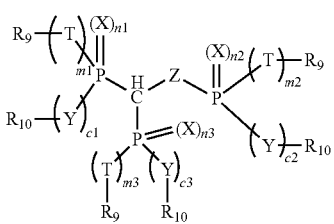
(III)

wherein n1, n2, n3, m1, m2, m3, c1, c2 and c3 are each individually 0 or 1, and m1 and c1 are both 0 or 1, m2 and c2 are both 0 or 1, or m3 and c3 are both 0 or 1; when m1, m2, m3, c1, c2 or c3 is 0, P is directly bonded to $R_9$ or $R_{10}$; X, Y, Z and T are each individually oxygen or sulfur; and $R_9$ and $R_{10}$ are each individually alkyl, aryl, alkoxy, aryloxy, sulfur-containing alkyl, sulfur-containing aryl, silyl, or siloxanyl. For example, in formula (III), at least one of n1, n2 and n3 is not 0. For example, in formula (III), $R_9$ and $R_{10}$ are each individually aryl or aryloxy.

In a preferred embodiment, the present disclosure provides a compound represented by the following formula (IV) to formula (VI):

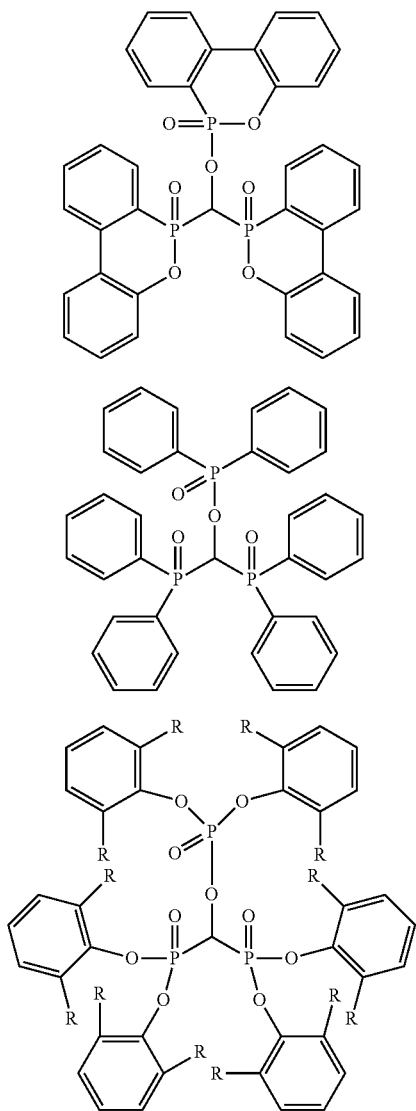

In formula (VI), R represents hydrogen, methyl or isopropyl.

The compound of formula (IV) has a phosphorus content of about 13.78%; the compound of formula (V) has a phosphorus content of about 14.69%; and the compound of formula (VI) has a phosphorus content of about 12.75% if R=H.

Any one of the above-mentioned compounds is preferably served as a flame retardant for a resin composition, but not limited thereto.

Moreover, any one of the above-mentioned compounds preferably has one, more or all properties described below:
High phosphorus content: such as, in atomic percentage, the phosphorus content is between 12% and 20%, such as greater than or equal to 12% or 15%.
High melting point: such as the melting point is between 300° C. and 400° C., such as greater than or equal to 300° C., 350° C. or 400° C.
High thermal decomposition temperature: such as the thermal decomposition temperature with 5% weight loss is between 350° C. and 450° C., such as greater than or equal to 350° C. or 400° C.

On the other hand, the present disclosure provides a method of preparing the aforesaid compounds, comprising a step of reacting a phosphorus-containing compound with bis(trichloromethyl) carbonate (a.k.a. triphosgene) or phosgene.

For example, as a reactant, the phosphorus-containing compound may be represented by the following formula (VII):

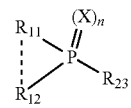
(VII)

wherein n is 0 or 1; X is oxygen or sulfur; dotted line represents presence or absence of a bond; $R_{11}$ and $R_{12}$ are each individually alkyl, aryl, alkoxy, aryloxy, sulfur-containing alkyl, sulfur-containing aryl, silyl, or siloxanyl; and $R_{23}$ represents hydrogen, silyl, or siloxanyl.

In another aspect, the present disclosure provides a resin composition, comprising 1 to 100 parts by weight of the aforesaid compound (e.g., any one or more of formula (I) to formula (VI)) serving as a first flame retardant and 100 parts by weight of reactive component.

In the resin composition, the amount of the first flame retardant may range from 1 to 100 parts by weight, such as, but not limited to, 10, 20, 30, 40, 50, 60, 70, 80 or 90 parts by weight, or such as, but not limited to, 5, 15, 25, 35, 45, 55, 65, 75, 85 or 95 parts by weight. In addition, the first flame retardant and the reactive component are preferably present in a weight ratio of between 1:2 and 1:20, such as between 1:2 and 1:10 or between 1:2 and 1:5.

In addition to the first flame retardant and the reactive component, the resin composition of the present disclosure may further optionally comprise other components, such as but not limited to at least one of a second flame retardant, inorganic filler, dispersing agent, antioxidant, toughening agent, silane coupling agent, solvent and curing accelerator.

In the present disclosure, the reactive component comprises any compound, mixture, reactive monomer or polymer capable of self-reacting or reacting with other components.

For example, the reactive component may comprise, but not limited to, epoxy resin, phenolic resin, isocyanate resin, cyanate ester resin, benzoxazine resin, anhydride, polyester, maleimide resin, polyphenylene ether resin, amine curing agent, phenoxy resin, small molecule vinyl compound, polyamide, polyimide, polyolefin or a combination thereof.

In another aspect, the present disclosure provides an article made from any one of the aforesaid resin compositions, which comprises a prepreg, a resin film, a resin film with copper foil (i.e., a resin-coated copper), a laminate or a printed circuit board.

In a preferred embodiment, laminates or other articles made from the aforesaid resin compositions are characterized by having one or more desirable properties including high glass transition temperature, low coefficient of thermal expansion, low dielectric constant, low dissipation factor, high thermal resistance, high flame retardancy and/or halogen-free, and are particularly suitable for circuit boards with high speed and high frequency transmission. The laminates may be further processed to provide circuit boards, which can be connected with electronic components and operated under severe conditions such as high temperature and high moisture without deteriorating the quality.

Compared with conventional approaches, compounds of the present disclosure have better flame retardancy. In addition, the compounds are characterized by having high melting point, inhibited ionization at high temperature (anti-CAF), and high thermal decomposition temperature, and a laminate made from the compounds of the present disclosure has one or more desirable properties including low coefficient of thermal expansion, high glass transition temperature, low dielectric constant, and low dissipation factor.

In a preferred embodiment, compounds of the present disclosure have one or more of the following desirable properties:
1. High structural symmetry and products made therefrom having excellent dielectric constant and dissipation factor.
2. High phosphorus content, such the phosphorus content being up to 12.75% or higher, providing better flame retardancy.
3. High melting point, such as a melting point being up to 315° C., and the products having low coefficient of thermal expansion, without influencing the glass transition temperature and modulus rigidity of the material.
4. High thermal decomposition temperature, such as a thermal decomposition temperature (Td at 5% weight loss) ≥354.40° C., high thermal resistance, with improved thermal expansion of the product, and inhibiting the occurrence of conductive anodic filament (CAF) of circuit boards made from the compound.
5. Simple preparation method and high efficiency (one-step reaction).

DETAILED DESCRIPTION OF EMBODIMENTS

Figure 1A:
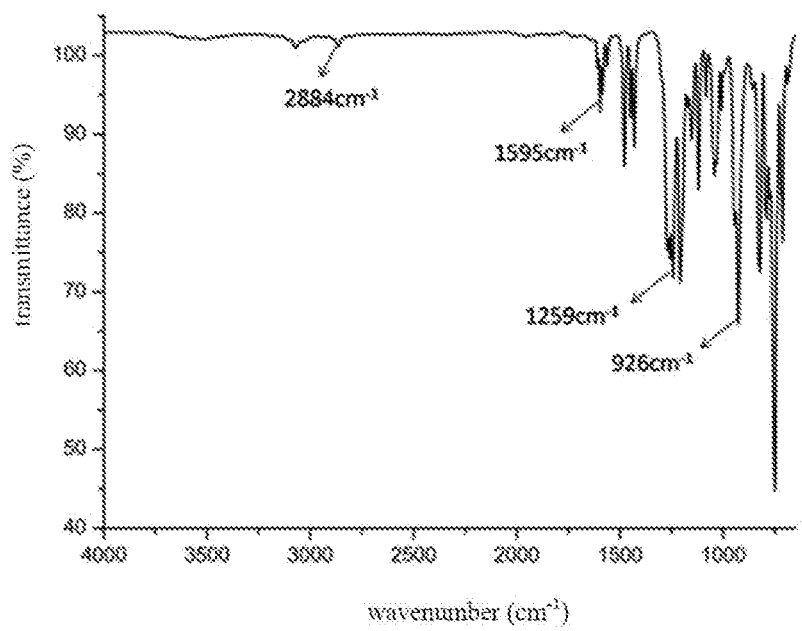
FIG. 1A illustrates the FTIR spectrum of compound of formula (IV)

To enable those skilled in the art to further appreciate the features and effects of the present disclosure, words and terms contained in the specification and appended claims are described and defined. Unless otherwise defined, all technical and scientific terms used herein have the same meaning as commonly understood by those of ordinary skill in the art to which this disclosure pertains. In the case of conflict, the present document and definitions contained herein will control.

As used herein, "a," "an" or similar expression is employed to describe elements and features of the present disclosure. This is done merely for convenience and to give a general sense of the scope of the present disclosure. Accordingly, this description should be read to include one or at least one and the singular also includes the plural unless it is obvious to mean otherwise.

As used herein, the term "comprises," "comprising," "includes," "including," "has," "having" or any other variant thereof is construed as an open-ended transitional phrase intended to cover a non-exclusive inclusion. For example, a composition or manufacture that comprises a list of elements is not necessarily limited to only those elements but may include other elements not expressly listed or inherent to such composition or manufacture. Further, unless expressly stated to the contrary, the term "or" refers to an inclusive or and not to an exclusive or. For example, a condition "A or B" is satisfied by any one of the following: A is true (or present) and B is false (or not present), A is false (or not present) and B is true (or present), and both A and B are true (or present). In addition, whenever open-ended transitional phrases are used, such as "comprises," "comprising," "includes," "including," "has," "having" or any other variant thereof, it is understood that transitional phrases such as "consisting essentially of" and "consisting of" are also disclosed and included.

In this disclosure, features or conditions presented as a numerical range or a percentage range are merely for convenience and brevity. Therefore, a numerical range or a percentage range should be interpreted as encompassing and specifically disclosing all possible subranges and individual numerals or values therein, particularly all integers therein. For example, a range of "1 to 8" or "between 1 and 8" should be understood as explicitly disclosing all subranges such as 1 to 7, 2 to 8, 2 to 6, 3 to 6, 4 to 8, 3 to 8 and so on, particularly all subranges defined by integers, as well as disclosing all individual values such as 1, 2, 3, 4, 5, 6, 7 and 8. Unless otherwise defined, the aforesaid interpretation rule should be applied throughout the present disclosure regardless broadness of the scope.

Whenever amount, concentration or other numeral or parameter is expressed as a range, a preferred range or a series of upper and lower limits, it is understood that all ranges defined by any pair of the upper limit or preferred value and the lower limit or preferred value are specifically disclosed, regardless whether these ranges are explicitly described or not. In addition, unless otherwise defined, whenever a range is mentioned, the range should be interpreted as inclusive of the endpoints and every integers and fractions in the range.

Given the intended purposes and advantages of this disclosure are achieved, numerals or figures have the precision of their significant digits. For example, 40.0 should be understood as covering a range of 39.50 to 40.49.

As used herein, a Markush group or a list of items is used to describe examples or embodiments of the present disclosure. A skilled artisan will appreciate that all subgroups of members or items and individual members or items of the Markush group or list can also be used to describe the present disclosure. For example, when X is described as being "selected from a group consisting of $X_1$, $X_2$ and $X_3$," it is intended to disclose the situations of X is $X_1$ and X is $X_1$ and/or $X_2$. In addition, when a Markush group or a list of items is used to describe examples or embodiments of the present disclosure, a skilled artisan will understand that any subgroup or any combination of the members or items in the Markush group or list may also be used to describe the present disclosure. Therefore, when X is described as being "selected from a group consisting of $X_1$, $X_2$ and $X_3$" and Y is described as being "selected from a group consisting of $Y_1$, $Y_2$ and $Y_3$," the disclosure of any combination of X is $X_1$ and/or $X_2$ and/or $X_3$ and Y is $Y_1$ and/or $Y_2$ and/or $Y_3$.

The following embodiments and examples are illustrative in nature and are not intended to limit the present disclosure and its application. In addition, the present disclosure is not bound by any theory described in the background and summary above or the following embodiments or examples.

Compound

In one embodiment, the compound of the present disclosure has a structure represented by the following formula (I):

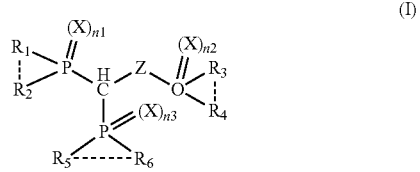

(I)

wherein, n1, n2 and n3 are each individually 0 or 1; X and Z are each individually oxygen or sulfur; dotted line represents presence or absence of a bond; and $R_1$, $R_2$, $R_3$, $R_4$, $R_5$ and $R_6$ are each individually alkyl, aryl, alkoxy, aryloxy, sulfur-containing alkyl, sulfur-containing aryl, silyl, or siloxanyl; for example, X and Z are oxygen. For example, $R_1$, $R_2$, $R_3$, $R_4$, $R_5$ and $R_6$ are each individually aryl or aryloxy (e.g., phenoxy group).

Unless otherwise specified, functional groups of various compounds disclosed herein are defined as below.

As used herein, "alkyl" represents a straight chain or branched chain saturated hydrocarbyl, such as $C_1$-$C_6$ saturated hydrocarbyl, such as methyl, ethyl, propyl, isopropyl, butyl, pentyl, hexyl and so on, but not limited thereto; "aryl" represents an aromatic ring system, such as $C_6$-$C_{18}$ aromatic substituent, such as phenyl, naphthyl, biphenyl group, anthryl and so on, but not limited thereto; "alkoxy" represents an oxygen-containing alkyl, such as methoxy, ethoxy, propoxy, isopropoxy, butoxy, pentoxy, hexoxy and so on, but not limited thereto; "aryloxy" represents an oxygen-containing aryl group; "sulfur-containing alkyl" represents an alkyl with sulfur atom; "sulfur-containing aryl" represents an aryl with sulfur atom; "silyl" represents a substituent with Si—H or Si—Si bond; and "siloxanyl" represents a substituent with Si—O bond.

In one embodiment, the compound of the present disclosure is represented by the following formula (II):

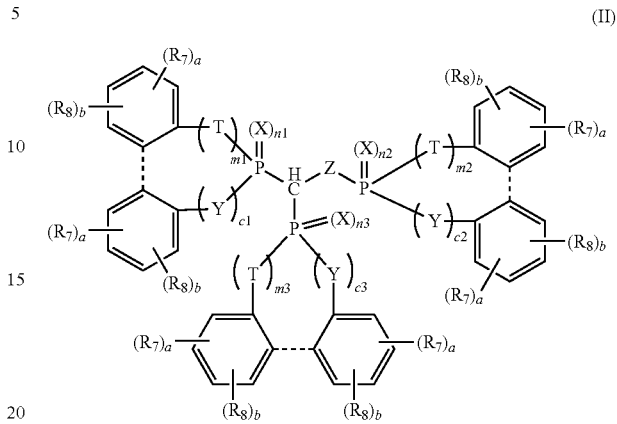

(II)

wherein n1, n2, n3, m1, m2, m3, c1, c2 and c3 are each individually 0 or 1, and when m1, m2, m3, c1, c2 or c3 is 0, P is directly bonded to the phenyl ring; X, Y, Z and T are each individually oxygen or sulfur; dotted line represents presence or absence of a bond (e.g., covalent bond), and when the dotted line represents presence of a bond, m1 and c1 are not both 1 at the same time, m2 and c2 are not both 1 at the same time, or m3 and c3 are not both 1 at the same time; $R_7$ and $R_8$ are each individually hydrogen, alkyl, aryl, alkoxy, aryloxy, sulfur-containing alkyl, sulfur-containing aryl, silyl, or siloxanyl; and a and b are each individually an integer of 1 to 3, and a+b 5. For example, X, Y, Z and T are oxygen.

In one embodiment, the compound of the present disclosure is represented by the following formula (III):

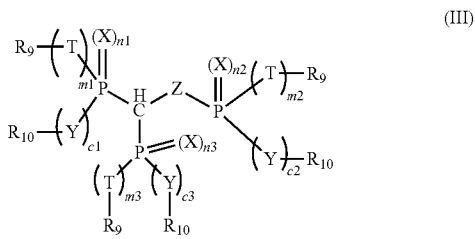

(III)

wherein n1, n2, n3, m1, m2, m3, c1, c2 and c3 are each individually 0 or 1, and m1 and c1 are both 0 or 1, m2 and c2 are both 0 or 1, or m3 and c3 are both 0 or 1, wherein when m1, m2, m3, c1, c2 or c3 is 0, P is directly bonded to $R_9$ or $R_{10}$; X, Y, Z and T are each individually oxygen or sulfur; and $R_9$ and $R_{10}$ are each individually alkyl, aryl, alkoxy, aryloxy, sulfur-containing alkyl, sulfur-containing aryl, silyl, or siloxanyl. For example, in formula (III), at least one of n1, n2 and n3 is not 0. For example, in formula (III), $R_9$ and $R_{10}$ are each individually aryl or aryloxy. For example, X, Y, Z and T are oxygen.

In a preferred embodiment, the present disclosure provides compounds represented by the following formula (IV) to formula (VI):

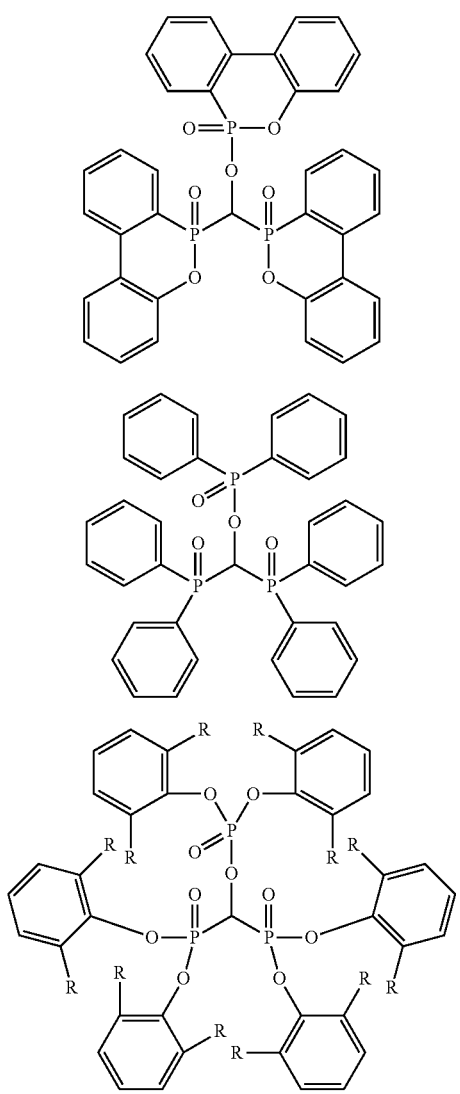

(IV)

(V)

(VI)

In formula (VI), R represents hydrogen, methyl or isopropyl.

Preparation of Compound

The present disclosure further provides a method of preparing the aforesaid compounds, comprising reacting a phosphorus-containing compound with triphosgene or phosgene.

Specifically, the preparation method involves reacting the phosphorus-containing compound and triphosgene or phosgene in solvent by heating to reflow; the reflow time may range from 1 hour to 10 hours, preferably between 2 hours and 10 hours, such as between 4 hours and 8 hours; temperature for heating to reflow is between 50° C. and 200° C., preferably between 50° C. and 120° C., such as between 70° C. and 120° C.

In a preferred embodiment, the mole ratio of the phosphorus-containing compound and triphosgene or phosgene is between 12:1 and 1:1, preferably between 10:1 and 3:1, such as between 10:1 and 4:1 or between 10:1 and 5:1.

In a preferred embodiment, the solvent is toluene (TL), dimethyl acetamide (DMAC), dimethyl formamide (DMF), propylene glycol methyl ether (PM), propylene glycol monomethyl ether acetate (PMA), cyclohexanone (CYC), acetone, methyl ethyl ketone (MEK) or a combination thereof.

In a preferred embodiment, after the reaction is completed, toluene is used to wash the crude product to remove byproducts and impurities to improve the purity of the compound thus obtained.

In one embodiment, the phosphorus-containing compound is represented by the following formula (VII):

(VII)

wherein n is 0 or 1; X is oxygen or sulfur; dotted line represents presence or absence of a bond; $R_{11}$ and $R_{12}$ are each individually alkyl, aryl, alkoxy, aryloxy, sulfur-containing alkyl, sulfur-containing aryl, silyl, or siloxanyl; and $R_{23}$ represents hydrogen, silyl, or siloxanyl; for example, $R_{23}$ is hydrogen or trimethylsilyloxy.

In one embodiment, the phosphorus-containing compound is represented by the following formula (VIII):

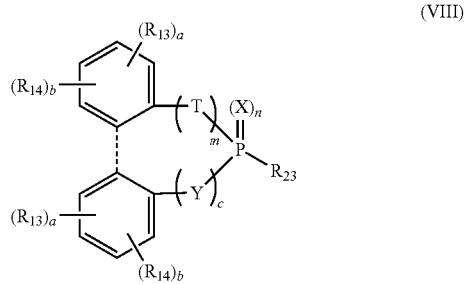

(VIII)

wherein n, m and c are each individually 0 or 1; X, Y and T are each individually oxygen or sulfur; dotted line represents presence or absence of a bond, and when the dotted line represents presence of a bond, m and c are not both 1 at the same time; $R_{13}$ and $R_{14}$ are each individually hydrogen, alkyl, aryl, alkoxy, aryloxy, sulfur-containing alkyl, sulfur-containing aryl, silyl, or siloxanyl; $R_{23}$ represents hydrogen, silyl, or siloxanyl; and a and b are each individually an integer of 1 to 3, and a+b≤5; for example, $R_{23}$ is hydrogen or trimethylsilyloxy.

In a preferred embodiment, the phosphorus-containing compound is represented by the following formula (IX):

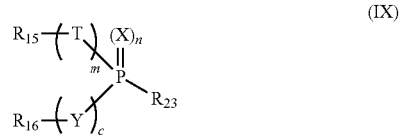

(IX)

wherein n is 0 or 1, such as 1; m and c are both 0 or 1; X, Y and T are each individually oxygen or sulfur; $R_{23}$ represents hydrogen, silyl, or siloxanyl; and $R_{15}$ and $R_{16}$ are each individually alkyl, aryl, alkoxy, aryloxy, sulfur-containing alkyl, sulfur-containing aryl, silyl, or siloxanyl, such as each individually being substituted or unsubstituted phenyl, biphenyl group, or naphthyl.

In one embodiment, the phosphorus-containing compound may be for example, but not limited to, phosphate ester, DOPO-containing compound or DPPO-containing compound.

In a preferred embodiment, the DOPO-containing compound is represented by formula (X):

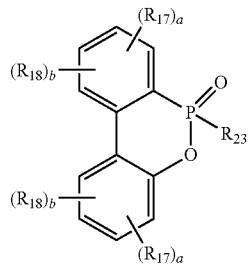
(X)

wherein $R_{17}$ and $R_{18}$ are each individually hydrogen, alkyl, aryl, alkoxy, aryloxy, sulfur-containing alkyl, sulfur-containing aryl, silyl, or siloxanyl, preferably substituted or unsubstituted phenyl, biphenyl group, or naphthyl; $R_{23}$ represents hydrogen, silyl, or siloxanyl; for example, $R_{23}$ is hydrogen or trimethylsilyloxy; and a and b are each individually an integer of 1 to 3, and a+b 5.

In a preferred embodiment, the DPPO-containing compound is represented by formula (XI):

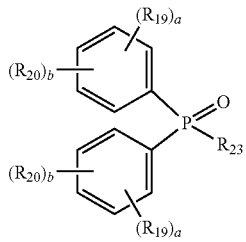
(XI)

wherein $R_{19}$ and $R_{20}$ are each individually hydrogen, alkyl, aryl, alkoxy, aryloxy, sulfur-containing alkyl, sulfur-containing aryl, silyl, or siloxanyl, preferably substituted or unsubstituted phenyl, biphenyl group, or naphthyl; $R_{23}$ represents hydrogen, silyl, or siloxanyl; for example, $R_{23}$ is hydrogen or trimethylsilyloxy; and a and b are each individually an integer of 1 to 3, and a+b≤5.

In a preferred embodiment, the phosphate ester s represented by formula (XII):

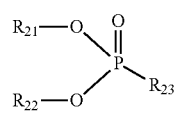
(XII)

wherein $R_{21}$ and $R_{22}$ are each individually alkyl, aryl, alkoxy, aryloxy, sulfur-containing alkyl, sulfur-containing aryl, silyl, or siloxanyl, preferably substituted or unsubstituted phenyl, biphenyl group, or naphthyl; and $R_{23}$ represents hydrogen, silyl, or siloxanyl; for example, $R_{23}$ is hydrogen or trimethylsilyloxy.

In a preferred embodiment, the phosphorus-containing compound is, but not limited to, represented by any one of formula (XIII) to formula (XX):

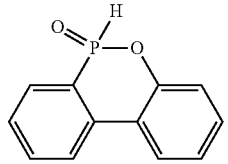
(XIII)

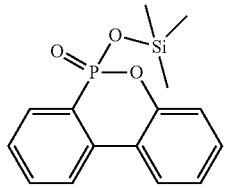
(XIV)

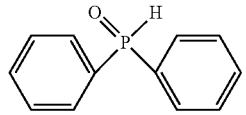
(XV)

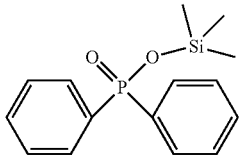
(XVI)

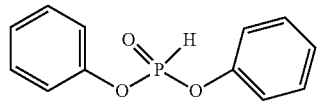
(XVII)

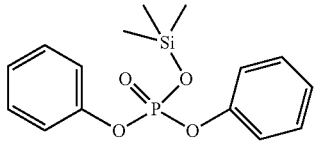
(XVIII)

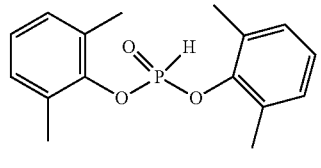
(XIX)

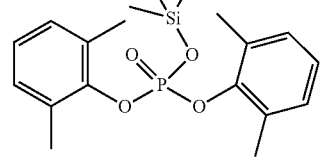
(XX)

Resin Composition

In the present disclosure, the resin composition comprises 1 to 100 parts by weight of the aforesaid compound (e.g., any one or more of formula (I) to formula (VI)) serving as a first flame retardant and 100 parts by weight of reactive component.

Accordingly, compared with other commercial or known phosphorus-containing flame retardants, the compound of the present disclosure serving as a first flame retardant is mixed with a reactive component to produce a resin composition useful for fabrication of circuit boards or other articles with improved one or more aspects in glass transition temperature, coefficient of thermal expansion, thermal resistance, flame retardancy, dielectric constant, and dissipation factor.

In a preferred embodiment, relative to 100 parts by weight of the reactive component, the amount of the first flame retardant may be but not limited to 1 to 100 parts by weight, such as 5, 10, 15, 20, 25, 30, 35, 40, 45, 50, 55, 60, 65, 70, 75, 80, 85, 90 or 95 parts by weight. In another preferred embodiment, relative to 100 parts by weight of the reactive component, the amount of the first flame retardant may be but not limited to 5 to 90 parts by weight, such as 10 to 80 parts by weight, 15 to 75 parts by weight, or 25 to 60 parts by weight.

In a preferred embodiment, relative to 100 parts by weight of the first flame retardant, the amount of the reactive component may be but not limited to 50 to 1000 parts by weight.

Unless otherwise specified, the amount or ratio of the first flame retardant and the reactive component may be adjusted according to different needs. For example, in one embodiment, the first flame retardant and the reactive component are preferably present in a weight ratio of between 1:2 and 1:20, preferably between 1:2 and 1:10, more preferably between 1:2 and 1:5.

The reactive component may comprise, but not limited to, epoxy resin, phenolic resin, isocyanate resin, cyanate ester resin, benzoxazine resin, anhydride, polyester, maleimide resin, polyphenylene ether resin, amine curing agent, phenoxy resin, small molecule vinyl compound, polyamide, polyimide, polyolefin or a combination thereof.

For example, the epoxy resin used in the present disclosure is not particularly limited and may be a resin with epoxy functional groups or a modified resin thereof. The epoxy resin may include any one or more epoxy resins useful for preparing a prepreg, a resin film, a resin film with copper foil, a laminate or a printed circuit board; examples include bisphenol A epoxy resin, bisphenol F epoxy resin, bisphenol S epoxy resin, bisphenol AD epoxy resin, novolac epoxy resin, trifunctional epoxy resin, tetrafunctional epoxy resin, multifunctional epoxy resin, dicyclopentadiene (DCPD) epoxy resin, phosphorus-containing epoxy resin, p-xylene epoxy resin, naphthalene epoxy resin (e.g., naphthol epoxy resin), benzopyran epoxy resin, anthracene epoxy resin, norbornene epoxy resin, adamantane epoxy resin, fluorene epoxy resin, biphenyl novolac epoxy resin or isocyanate-modified epoxy resin. The novolac epoxy resin may include phenol novolac epoxy resin, bisphenol A novolac epoxy resin, bisphenol F novolac epoxy resin, biphenyl novolac epoxy resin, phenol benzaldehyde epoxy resin, triphenylmethyl epoxy resin, phenol aralkyl novolac epoxy resin or o-cresol novolac epoxy resin; the phosphorus-containing epoxy resin may include DOPO-containing epoxy resin or DPPO-containing (diphenylphosphine oxide) epoxy resin; the DOPO-containing epoxy resin may be a DOPO-containing phenol novolac (DOPO-PN) epoxy resin, DOPO-containing cresol novolac (DOPO-CN) epoxy resin, DOPO-containing bisphenol novolac (DOPO-BPN) epoxy resin, such as a DOPO-containing bisphenol A novolac epoxy resin or DOPO-containing bisphenol F novolac epoxy resin; the DOPO-containing epoxy resin may also be a DOPO-HQ containing PN epoxy resin, DOPO-HQ-CN containing epoxy resin, or DOPO-HQ-BPN containing epoxy resin; the DOPO-containing epoxy resin may also be a DOPO-NQ containing phenol novolac epoxy resin.

For example, the phenolic resin used in the present disclosure is a monomer, polymer or mixture thereof containing one or more phenolic hydroxyl groups. The phenolic resin is not particularly limited and may include a phenolic curing agent useful for accelerating the curing of cyanate ester resin or useful as a curing agent for epoxy resin. Examples include but are not limited to phenol, bisphenol A, bisphenol F, phenolic amine, tri(hydroxyphenyl) alkane, tetrafunctional phenol, novolac resin or a combination thereof. Examples of novolac resin include but are not limited to phenol aralkyl resin, dicyclopentadiene phenol resin, biphenyl phenol novolac resin, phenol-modified polybutadiene, phenol novolac resin or a combination thereof.

For example, the cyanate ester resin used herein is not particularly limited and may include any one or more cyanate ester resins useful for preparing a prepreg, a resin film, a resin film with copper foil, a laminate or a printed circuit board, such as a compound having an Ar—O—C≡N structure; wherein Ar may be a substituted or unsubstituted aromatic group. Examples include but are not limited to novolac cyanate ester resin, bisphenol A cyanate ester resin, bisphenol F cyanate ester resin, dicyclopentadiene-containing cyanate ester resin, naphthalene-containing cyanate ester resin, phenolphthalein cyanate ester resin, adamantane cyanate ester resin or fluorene cyanate ester resin. The novolac cyanate ester resin may be bisphenol A novolac cyanate ester resin, bisphenol F novolac cyanate ester resin or a combination thereof. For example, the cyanate ester resin may be available under the tradename Primaset PT-15, PT-30S, PT-60S, CT-90, BADCY, BA-100-10T, BA-200, BA-230S, BA-300S, BTP-2500, BTP-6020S, DT-4000, DT-7000, Methylcy, and ME-240S available from Lonza.

For example, unless otherwise specified, the isocyanate resin used herein is not particularly limited and may include any one or more isocyanate resins useful for preparing a prepreg, a resin film, a resin film with copper foil, a laminate or a printed circuit board. Examples include but are not limited to 1,4-cyclohexane diisocyanate, isophorone diisocyanate, methylene bis(4-cyclohexylisocyanate), hydrogenated 1,3-xylylene diisocyanate and hydrogenated 1,4-xylylene diisocyanate.

For example, a suitable benzoxazine resin of the present disclosure may be any one or more benzoxazine resins useful for preparing a prepreg, a resin film, a resin film with copper foil, a laminate or a printed circuit board. Examples include but are not limited to bisphenol A benzoxazine resin, bisphenol F benzoxazine resin, phenolphthalein benzoxazine resin, dicyclopentadiene benzoxazine resin, phosphorus-containing benzoxazine resin, dianiline benzoxazine resin and vinyl-modified or allyl-modified benzoxazine resin. Such as LZ-8270 (phenolphthalein benzoxazine resin), LZ-8280 (bisphenol F benzoxazine resin), and LZ-8290 (bisphenol A benzoxazine resin) available from Huntsman or HFB-2006M available from Showa High Polymer. The dianiline benzoxazine resin may be diaminodiphenylmethane benzoxazine resin, diaminodiphenyl ether benzoxazine resin, diaminodiphenyl sulfone benzoxazine resin, diaminodiphenyl sulfide benzoxazine resin or a combination thereof.

Unless otherwise specified, the anhydride used herein is not particularly limited and may be a mono-functional, bifunctional or multifunctional anhydride. A mono-functional anhydride contains one cyclic anhydride group (—COOCO—) per molecule. Examples of dicarboxylic anhydride compound include maleic anhydride, phthalic anhydride, 4-methylhexahydrophthalic anhydride, hexahydrophthalic anhydride, methylbicyclo[2.2.1]heptane-2,3-dicarboxylic anhydride, bicyclo[2.2.1]heptane-2,3-dicarboxylic anhydride, and 1,2,3,6-tetrahydrophthalic anhydride.

Examples may further include tricarboxylic anhydride compounds, such as trimellitic anhydride. In particular, in order to lower dielectric constant, preferred examples include 4-methylhexahydrophthalic anhydride, hexahydrophthalic anhydride, methylbicyclo[2.2.1] heptane-2,3-dicarboxylic anhydride, bicyclo[2.2.1]heptane-2,3-dicarboxylic anhydride, 1,2,3,6-tetrahydrophthalic anhydride and other alicyclic anhydrides.

Examples of bifunctional anhydride include pyromellitic dianhydride (PMDA), hydrogenated pyromellitic dianhydride (H-PMDA) and 5-(2,5-dioxotetrahydro-3-furyl)-3-methyl-3-cyclohexene-1,2-dicarboxylic anhydride (MCTC).

Examples of multifunctional anhydride include the binary copolymer SMA obtained by reacting styrene monomer with maleic anhydride so as to form the anhydride with multiple anhydride groups. Depending on the different arrangements of styrene monomer and maleic anhydride, SMA can be categorized as alternating copolymer, random copolymer, block copolymer, or graft copolymer. Any kind of the above copolymers may be used in the present disclosure. In the styrene maleic anhydride resin, the molar ratio of styrene to maleic anhydride is 1:1, 2:1, 3:1, 4:1, 6:1, 8:1 or 12:1. Useful styrene maleic anhydride may be but not limited to styrene maleic anhydride copolymers such as SMA 1000, SMA 2000, SMA 3000, SMA EF-30, SMA EF-40, SMA EF-60 and SMA EF-80 available from Cray Valley. Additionally, the styrene maleic anhydride resin may also be an esterified styrene maleic anhydride copolymer, such as esterified styrene maleic anhydride copolymers SMA 1440, SMA 17352, SMA 2625, SMA 3840 and SMA 31890 available from Cray Valley. The styrene maleic anhydride resin can be added individually or as a combination to the resin composition of this disclosure.

In the resin composition, the maleimide resin refers to a compound, monomer, mixture, oligomer or polymer containing at least one maleimide group. Unless otherwise specified, the maleimide resin used in the present disclosure is not particularly limited and may include any one or more maleimide resins useful for preparing a prepreg, a resin film, a resin film with copper foil, a laminate or a printed circuit board. Examples include but are not limited to 4,4'-diphenylmethane bismaleimide, oligomer of phenylmethane maleimide (a.k.a. polyphenylmethane maleimide), m-phenylene bismaleimide, bisphenol A diphenyl ether bismaleimide, 3,3'-dimethyl-5,5'-diethyl-4,4'-diphenylmethane bismaleimide, 4-methyl-1,3-phenylene bismaleimide, 1,6-bismaleimide-(2,2,4-trimethyl hexane), N-2,3-xylylmaleimide, N-2,6-xylenemaleimide, N-phenylmaleimide, maleimide compound containing aliphatic long chain structure, prepolymer thereof or a combination thereof. The aforesaid prepolymer may for example be a prepolymer of diallyl compound and maleimide compound, a prepolymer of diamine and maleimide compound, a prepolymer of multi-functional amine and maleimide compound or a prepolymer of acid phenol compound and maleimide compound.

For example, the maleimide resin may include products such as BMI-70, BMI-80, BMI-1000, BMI-1000H, BMI-1100, BMI-1100H, BMI-2000, BMI-2300, BMI-3000, BMI-3000H, BMI-4000H, BMI-5000, BMI-5100, BMI-7000 and BMI-7000H available from Daiwa Kasei Co., Ltd.

For example, the maleimide resin containing aliphatic long chain structure may include products such as BMI-689, BMI-1400, BMI-1500, BMI-1700, BMI-2500, BMI-3000, BMI-5000 and BMI-6000 available from Designer Molecules Inc.

For example, polyesters useful in the present disclosure may be obtained by esterification of an aromatic compound with two carboxylic groups and an aromatic compound with two hydroxyl groups, such as HPC-8000T65 commercially available from DIC Corporation.

Unless otherwise specified, the polyphenylene oxide resin or polyphenylene ether resin used in the present disclosure is not particularly limited and may include any one or more polyphenylene oxide resins or polyphenylene ether resins useful for preparing a prepreg, a resin film, a resin film with copper foil, a laminate or a printed circuit board. Examples include, but not limited to, dihydroxyl-terminated polyphenylene oxide resin (e.g., SA-90 available from SABIC), vinylbenzyl-terminated biphenyl polyphenylene oxide resin (e.g., OPE-2st available from Mitsubishi Gas Chemical Co., Inc.), vinyl-benzylated modified bisphenol A polyphenylene oxide and methacrylic polyphenylene oxide resin (e.g., SA-9000 available from SABIC).

Unless otherwise specified, the amine curing agent used herein is not particularly limited and may include any one or more amine curing agents useful for preparing a prepreg, a resin film, a resin film with copper foil, a laminate or a printed circuit board. Examples include but are not limited to any one or a combination of diamino diphenyl sulfone, diamino diphenyl methane, diamino diphenyl ether, diamino diphenyl sulfide and dicyandiamide (DICY).

Unless otherwise specified, the small molecule vinyl compound used herein may include any one or more vinyl compounds with molecular weight less than 1000 useful for preparing a prepreg, a resin film, a resin film with copper foil, a laminate or a printed circuit board. The small molecule vinyl compound may have a molecular weight of less than 500 for example. The small molecule vinyl compound may be any monomer, oligomer or polymer with one or more C=C double bonds; examples include but are not limited to styrene monomers such as styrene, bromostyrene, and dibromostyrene, divinylbenzene, pentabromobenzyl acrylate, trivinylcyclohexane, triallyl isocyanurate, triallyl cyanurate, isocyanurate triacrylate and a combination thereof.

In some situations, if the small molecule vinyl compound contains bromine, then the small molecule vinyl compound may serve as a part of all flame retardants of the composition, such as bromo-styrene, dibromostyrene and pentabromobenzyl acrylate are all candidates of the flame retardants. Therefore, the small molecule vinyl compound may be incorporated in the resin composition of the present disclosure to serve as a reactive monomer, as a flame retardant or both.

Unless otherwise specified, the polyolefin used in the present disclosure is not particularly limited and may include any one or more polyolefins useful for preparing a prepreg, a resin film, a resin film with copper foil, a laminate or a printed circuit board. Examples include but are not limited to styrene-butadiene-divinylbenzene terpolymer, styrene-butadiene-maleic anhydride terpolymer, vinyl-polybutadiene-urethane oligomer, styrene butadiene copolymer, hydrogenated styrene butadiene copolymer, styrene isoprene copolymer, hydrogenated styrene isoprene copolymer, methylstyrene copolymer, polybutadiene, petroleum resin, cycloolefin copolymer and a combination thereof.

In addition, the resin composition of the present disclosure may optionally further comprise other ingredients, such as at least one of a second flame retardant, inorganic filler, dispersing agent, antioxidant, toughening agent, silane coupling agent, solvent and curing accelerator; relative to 100 parts by weight of the reactive component, the second flame retardant, inorganic filler, dispersing agent, antioxidant, toughening agent, silane coupling agent, solvent and curing accelerator may be individually present in an amount of between 0.001 part by weight and 500 parts by weight, such as between 0.001 part by weight and 250 parts by weight.

In addition to the first flame retardant, the resin composition may further comprise a second flame retardant. Unless otherwise specified, the second flame retardant used in the present disclosure is not particularly limited; relative to 100 parts by weight of the reactive component, the second flame retardant may be present in an amount of 1 part by weight to 100 parts by weight, such as 1 part by weight to 80 parts by weight, 1 part by weight to 60 parts by weight or 1 part by weight to 40 parts by weight. In one embodiment, in the resin composition, the first flame retardant may be present in an amount of greater than or equal to that of the second flame retardant, such as the first flame retardant may be present in an amount of greater than that of the second flame retardant. The second flame retardant may be any one or more flame retardants useful for preparing a prepreg, a resin film, a resin film with copper foil, a laminate or a printed circuit board; examples of flame retardant include but are not limited to phosphorus-containing flame retardant, preferably any one or more selected from the following group: ammonium polyphosphate, hydroquinone bis-(diphenyl phosphate), bisphenol A bis-(diphenylphosphate), tri(2-carboxyethyl) phosphine (TCEP), phosphoric acid tris(chloroisopropyl) ester, trimethyl phosphate (TMP), dimethyl methyl phosphonate (DMMP), condensed phosphate ester (such as resorcinol bis(dixylenyl phosphate), RDXP), such as commercially available PX-200, PX-201, and PX-202, phosphazene (such as commercially available SPB-100, SPH-100, and SPV-100), melamine polyphosphate, DOPO and its derivatives or resins, DPPO (diphenylphosphine oxide) and its derivatives or resins, melamine cyanurate, tri-hydroxy ethyl isocyanurate and aluminum phosphinate (commercially available OP-930 and OP-935).

For example, the second flame retardant may be a DPPO compound (e.g., di-DPPO compound), a DOPO compound (e.g., di-DOPO compound), a DOPO resin (e.g., DOPO-HQ, DOPO-NQ, DOPO-PN, and DOPO-BPN) and a DOPO-containing epoxy resin, wherein DOPO-PN is a DOPO phenol novolac compound, and DOPO-BPN may be a bisphenol novolac compound, such as DOPO-BPAN (DOPO-bisphenol A novolac), DOPO-BPFN (DOPO-bisphenol F novolac) and DOPO-BPSN (DOPO-bisphenol S novolac).

In one embodiment, relative to 100 parts by weight of the reactive component, the resin composition of the present disclosure may further comprise 10 to 300 parts by weight of the inorganic filler, such as 10 to 200 parts by weight, so as to promote the thermal conductivity of the resin composition or improve its thermal expansion and mechanical strength, wherein the inorganic filler added thereto can be uniformly distributed in the resin composition.

For example, a suitable inorganic filler is not particularly limited and may comprise silica (fused, non-fused, porous or hollow type), aluminum oxide, aluminum hydroxide, magnesium oxide, magnesium hydroxide, calcium carbonate, aluminum nitride, boron nitride, aluminum silicon carbide, silicon carbide, sodium carbonate, titanium dioxide, zinc oxide, zirconium oxide, quartz, diamond powder, diamond-like carbon powder, graphite, magnesium carbonate, potassium titanate, ceramic fiber, mica, boehmite (AlOOH), zinc molybdate, ammonium molybdate, zinc borate, calcium phosphate, calcinated talc, talc, silicon nitride, mullite, calcinated kaolin, clay, basic magnesium sulfate whisker, mullite whisker, barium sulfate, magnesium hydroxide whisker, magnesium oxide whisker, calcium oxide whisker, carbon nanotube, nano-scale silica and associated inorganic powder, and powder particles having an organic core and a shell modified by an insulator. In addition, the inorganic filler may be spherical, fibrous, plate-like, particulate, sheet-like or whisker-like and can be optionally pretreated by a silane coupling agent.

In the present disclosure, the purpose of adding solvent is to change the solid content of the resin composition and to adjust the viscosity of the resin composition; relative to 100 parts by weight of the reactive component, the solvent may be used at an amount of 30 to 300 parts by weight. Unless otherwise specified, the solvent used in the present disclosure is not particularly limited as long as it is suitable for dissolving or diluting the resin composition, examples including but not limited to methanol, ethanol, ethylene glycol monomethyl ether, acetone, butanone (methyl ethyl ketone), methyl isobutyl ketone, cyclohexanone, toluene, xylene, methoxyethyl acetate, ethoxyethyl acetate, propoxyethyl acetate, ethyl acetate, dimethyl formamide, dimethyl acetamide, propylene glycol methyl ether, or a mixture thereof.

In the present disclosure, any curing accelerator capable of increasing the curing rate of the resin composition of this disclosure is useful. Relative to 100 parts by weight of the reactive component, the curing accelerator may be present in an amount of between 0.01 part by weight and 10 parts by weight. The resin composition disclosed herein can be optionally added with one or more curing accelerators to increase the curing rate. The curing accelerator may comprise a catalyst, such as a Lewis base or a Lewis acid. The Lewis base includes imidazole, boron trifluoride amine complex, ethyltriphenyl phosphonium chloride, 2-methylimidazole, 2-phenylimidazole, 2-ethyl-4-methylimidazole, triphenylphosphine, and/or 4-dimethylaminopyridine. The Lewis acid may comprise metal salt compounds, such as those of manganese, iron, cobalt, nickel, copper and zinc, preferably zinc octanoate, cobalt octanoate, zinc acetylacetonate, and cobalt acetylacetonate as a metal catalyst. Alternatively, the curing accelerator may comprise a peroxide capable of producing free radicals, including but not limited to dicumyl peroxide, tert-butyl peroxybenzoate, 2,5-dimethyl-2,5-di(tert-butylperoxy)-3-hexyne, di(tert-butylperoxyisopropyl)benzene or any combination thereof.

Unless otherwise specified, the toughening agent used in the present disclosure is not particularly limited and may be any one or more toughening agents useful for preparing a prepreg, a resin film, a resin film with copper foil, a laminate or a printed circuit board, examples including but not limited to rubber resin, carboxyl-terminated butadiene-acrylonitrile (CTBN), and core-shell rubber.

Unless otherwise specified, the silane coupling agent used in the present disclosure is not particularly limited and may be any one or more silane coupling agents useful for preparing a prepreg, a resin film, a resin film with copper foil, a laminate or a printed circuit board, examples including but not limited to silane (e.g., siloxane), which can be further categorized, according to the functional groups, into amino silane, vinyl silane, acrylic silane, and epoxy silane.

Articles Made from Resin Compositions

The resin composition may be processed by various methods into different articles, such as those suitable for use as components in electronic products, including but not limited to a prepreg, a resin film, a resin film with copper foil, a laminate or a printed circuit board.

Specifically, the present disclosure provides a prepreg, which has an reinforcement material and an insulation layer formed thereon, wherein the insulation layer is made by heating the resin composition to a semi-cured state (B-stage) at a temperature for example between 100° C. and 190° C. The reinforcement material may be woven fabric or non-woven fabric, such as fibrous material, including fiberglass fabrics, which can increase the mechanical strength of the prepreg. Types of fiberglass fabrics are not particularly limited and may be any commercial fiberglass fabric useful for various printed circuit boards, such as E-glass fabric, D-glass fabric, S-glass fabric, T-glass fabric, L-glass fabric or NE-glass fabric, wherein the fiber may comprise yarns and rovings, in spread form or standard form. Non-woven fabric comprises liquid crystal polymer non-woven fabric, such as polyester non-woven fabric, polyurethane non-woven fabric and so on, but not limited thereto. Woven fabric may also comprise liquid crystal polymer woven fabric, such as polyester woven fabric, polyurethane woven fabric and so on, but not limited thereto. Preferably, the reinforcement material can be optionally pre-treated by silane coupling agent.

The article made from the resin composition may be a resin film prepared by heating and baking to semi-cure the resin composition. The resin composition may be selectively coated on a polyethylene terephthalate film (PET film), a polyimide film (PI film), a liquid crystal polymer film or a resin-coated copper (RCC), followed by heating and baking to semi-cure the resin composition to form the resin film.

In one embodiment for making the resin film with copper foil, the resin composition from each example is coated on a copper foil, to uniformly adhere the resin composition varnish (thickness of about 30 μm) to the copper foil, followed by heating to a semi-cured state, thereby obtaining the resin film with copper foil.

In another embodiment for making the resin film with copper foil, the resin composition from each example is coated on a PI film of copper foil with PI film to uniformly adhere the resin composition (e.g., thickness of about 30 μm) on the film, followed by heating and baking to the semi-cured state to obtain the resin film.

The aforesaid copper foil may be an ordinary copper foil or a carrier-attached ultra-thin copper foil, such as a carrier-attached ultra-thin copper foil of 2 μm or 3 μm in thickness (copper thickness of ultra-thin copper foil is 2 μm or 3 μm and copper thickness of carrier copper foil is 18 μm or 35 μm).

Resin compositions of various embodiments of the present disclosure may be made into a laminate, such as a copper-clad laminate, which comprises at least two metal foil layers and an insulation layer disposed between the metal foils, wherein the insulation layer is made by curing the resin composition at high temperature and high pressure, a suitable curing temperature being for example between 150° C. and 220° C. and preferably between 190° C. and 210° C., for a curing time of 90 to 180 minutes, preferably 120 to 150 minutes. The insulation layer may be the aforesaid prepreg or resin film, and the metal foil may be copper, aluminum, nickel, platinum, silver, gold or alloy thereof, such as a copper foil.

The laminate may be further subject to known printed circuit board processes to make a printed circuit board. For example, a double-sided copper-clad laminate (such as product name EM-827, available from Elite Material Co., Ltd.) with a thickness of 28 mil and a 1 ounce (oz) HTE (High Temperature Elongation) copper foil may be provided and subject to hole-drilling and then electroplating, so as to form electrical conduction between the upper layer copper foil and the bottom layer copper foil, so as to make a printed circuit board. Then etch the upper layer copper foil and the bottom layer copper foil to form inner layer circuits. Then perform brown oxidation and roughening on the inner layer circuits to form uneven structure on the surface to increase roughness. Next, a vacuum lamination apparatus is used to laminate the assembly of a carrier-attached ultra-thin copper foil, the prepreg, the inner layer circuits, the prepreg and a carrier-attached ultra-thin copper foil by heating at 195° C. for 75 minutes to cure the insulation material of the prepregs. After removing the carrier of the carrier-attached ultra-thin copper foils, perform black oxidation, drilling, copper plating and other known circuit board processes on the outmost ultra-thin copper foil so as to obtain the printed circuit board.

The resin composition of the present disclosure and various articles made therefrom may have any one or a combination of the following properties:

(1) a glass transition temperature as measured by reference to IPC-TM-650 2.4.24.4 of greater than or equal to 210° C., such as greater than or equal to 213° C., or greater than or equal to 215° C.;

(2) a z-axis coefficient of thermal expansion as measured by reference to IPC-TM-650 2.4.24.5 of less than or equal to 45 ppm/° C., such as less than or equal to 43 ppm/° C., or less than or equal to 40 ppm/° C.;

(3) no delamination occurs after 20 cycles of solder dip test;

(4) flame retardancy of V-0 rating as measured by reference to UL94;

(5) no delamination occurs after 3-hour moisture absorption as measured by reference to IPC-TM-650 2.6.16.1;

(6) a dielectric constant at 10 GHz as measured by reference to JIS C2565 of less than or equal to 3.65, such as less than or equal to 3.63, or less than or equal to 3.60; and (7) a dissipation factor at 10 GHz as measured by reference to JIS C2565 of less than or equal to 0.0065, such as less than or equal to 0.0062, or less than or equal to 0.0060.

PREPARATION EXAMPLES

Preparation Example 1: Compound of Formula (IV)

In a 2000 mL three-necked bottle inserted with a thermometer and a condensation tube, add 1000 mL of toluene and 0.9 mole (about 195 g) of DOPO, followed by heating (about 80° C.) and stirring to promote dissolution until the solution becomes clear. Triphosgene (0.1 mole, 29.8 g) dissolved in toluene is transferred to a constant pressure funnel and slowly dropped into the flask in the presence of nitrogen gas protection, and then heated to a temperature of equal to or higher than the boiling point of the solvent (e.g., 120° C.) to reflow. After 6 hours of reaction, cool the solution to room temperature, followed by filtering and vacuum drying to obtain white powder, with a yield of 92.5%.

Figure 1B:
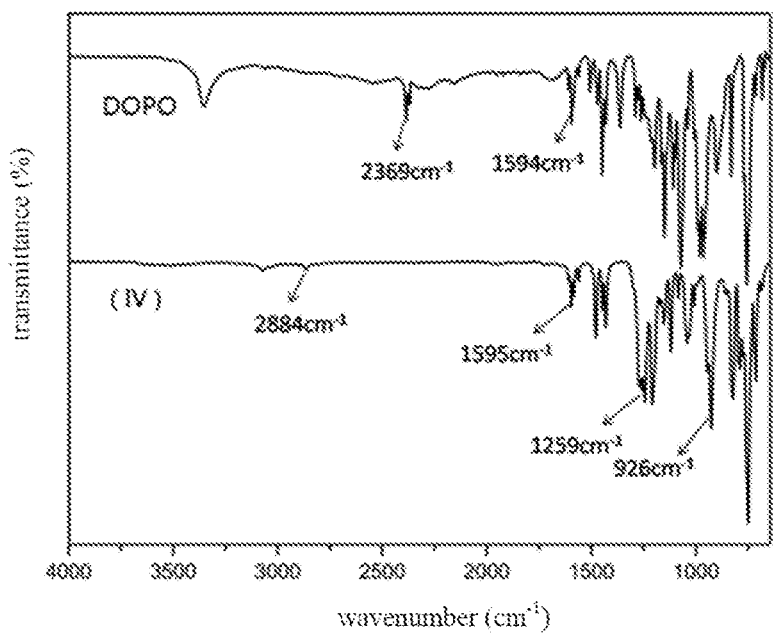
FIG. 1B contrasts the FTIR spectra of compound of formula (IV) and DOPO.

Analyze the white powder by using Fourier transform infrared spectroscopy (FTIR), with the result shown in FIGS. 1A and 1B. As can be observed from FIG. 1A, characteristic peaks in FTIR spectrum appear at 2884 cm$^{-1}$ (—CH), 1595 cm$^{-1}$ (P-Ph), 1259 cm$^{-1}$ (P=O) and 926 cm$^{-1}$ (P—O-Ph). FIG. 1B contrasts the FTIR spectra of compound of formula (IV) and DOPO, wherein characteristic peaks of P—O-Ph (926 cm$^{-1}$) and —CH (2884 cm$^{-1}$) appear in formula (IV), with significantly enhanced P=O (1259 cm$^{-1}$) peak; $^1$H-NMR (400 MHz, CDCl$_3$) analysis of the white powder can be observed from FIGS. 2A and 2B (FIG.

Figure 2A:
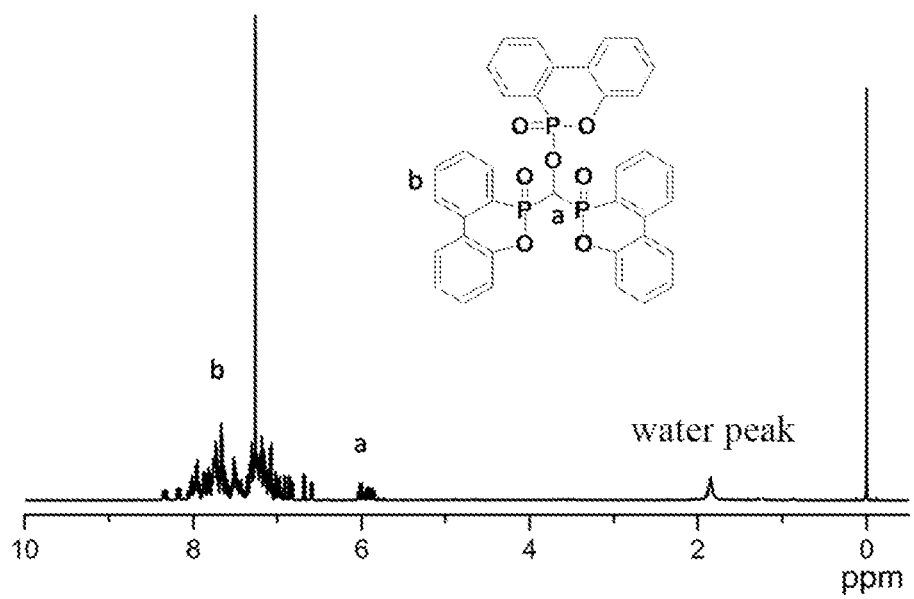
FIG. 2A illustrates the $^1$H-NMR spectrum of compound of formula (IV)
Figure 2B:
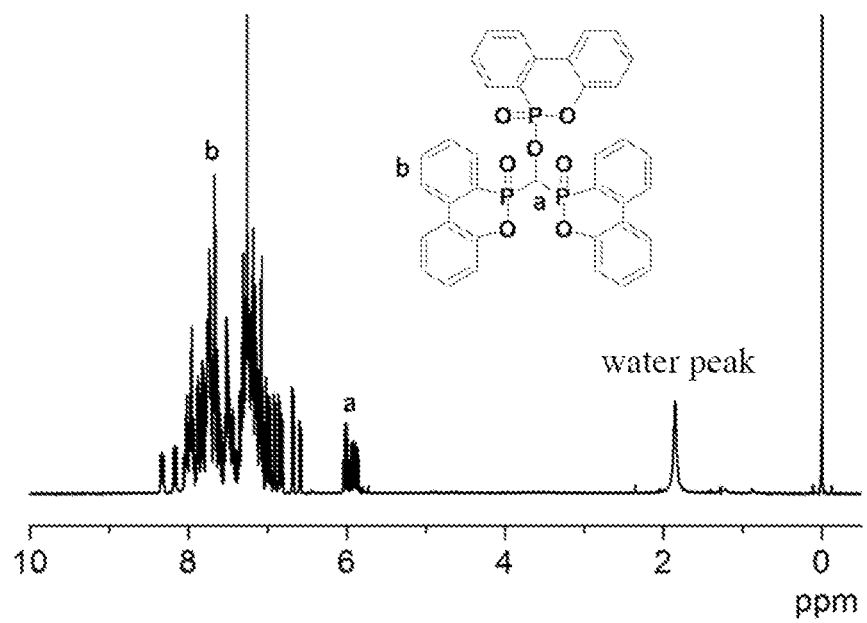
FIG. 2B is a partially enlarged $^1$H-NMR spectrum of FIG. 2A.

2B is the partially enlarged $^1$H-NMR spectrum of FIG. 2A). As shown in FIGS. 2A and 2B, characteristic peaks in $^1$H-NMR spectrum include: δ=5.8-6.1 ppm (—CH, i.e., position "a" in FIGS. 2A and 2B) and δ=6.6-8.4 ppm (hydrogen on benzene ring, i.e., position "b" in FIGS. 2A and 2B). The results of FTIR and $^1$H-NMR analysis indicate that the white powder product has the structure of formula (IV).

Preparation Example 2: Compound of Formula (V)

In a 2000 mL three-necked bottle inserted with a thermometer and a condensation tube, add 1000 mL of toluene and 1 mole (about 202 g) of DPPO, followed by heating (about 80° C.) and stirring to promote dissolution until the solution becomes clear. Triphosgene (0.1 mole, 29.8 g) dissolved in toluene is transferred to a constant pressure funnel and slowly dropped into the flask in the presence of nitrogen gas protection to carry out reflow at a temperature of equal to or higher than the boiling point of the solvent (e.g., 120° C.). After 6 hours of reaction, cool the solution to room temperature, followed by filtering and vacuum drying to obtain white powder, with a yield of 91.5%.

Preparation Example 3: Compound of Formula (VI)

In a 2000 mL three-necked bottle inserted with a thermometer and a condensation tube, add 1000 mL of toluene and 0.9 mole (about 261.3 g) of bis(2,6-dimethylphenyl)phosphate (formula (XIX)), followed by heating (about 80° C.) and stirring to promote dissolution until the solution becomes clear. Triphosgene (0.1 mole, 29.8 g) dissolved in toluene is transferred to a constant pressure funnel and slowly dropped into the flask in the presence of nitrogen gas protection to carry out reflow at a temperature of equal to or higher than the boiling point of the solvent (e.g., 120° C.). After 6 hours of reaction, cool the solution to room temperature, followed by filtering and vacuum drying to obtain white powder having the structure of formula (VI) wherein R represents methyl, with a yield of 90.5%.

Figure 3:
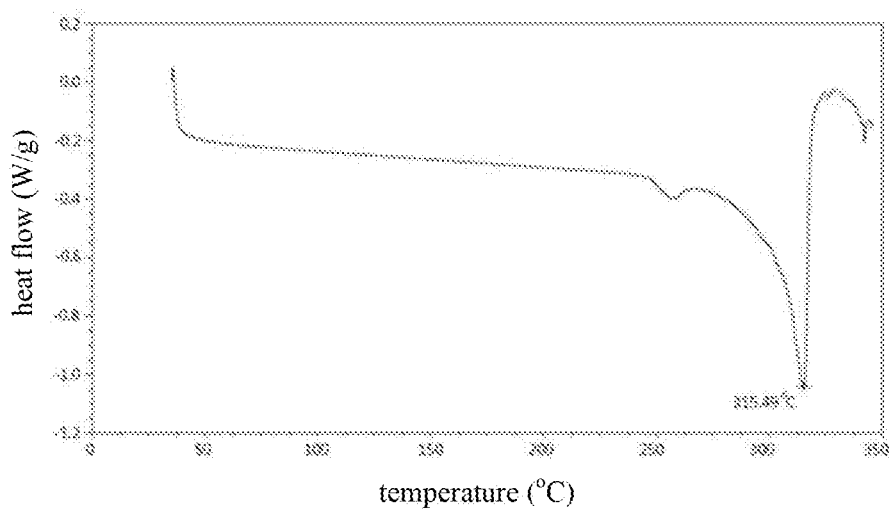
FIG. 3 illustrates the melting point analysis of compound of formula (IV)

In addition, as shown in FIG. 3, results from a differential scanning calorimeter (DSC) indicate that compound of formula (IV) has a melting point of about 315.5° C.

As can be observed from the structure, compared with conventional phosphorus-containing flame retardants, the compound of the present disclosure contains three phosphorus atoms, greater than the amount of the conventional phosphorus-containing flame retardants, therefore providing better flame retardancy.

Commercial phosphazene compound, such as SPB-100, has a melting point of 110° C.; resorcinol bis[di(2,6-dimethylphenyl)phosphate] (PX-200) has a melting point of 95° C.; di-DOPO phosphorus-containing high melting point flame retardant (Di-DOPO) has a melting point of up to 200° C. or higher, such as formula (XXI) below, which has a melting point of 278° C.; such as formula (XXV) below, which has a melting point of 269° C. The compound of formula (IV) made from the preparation example according to the present disclosure has high melting point and high thermal stability, and products made therefrom may have one or more of improved coefficient of thermal expansion, glass transition temperature and elastic modulus.

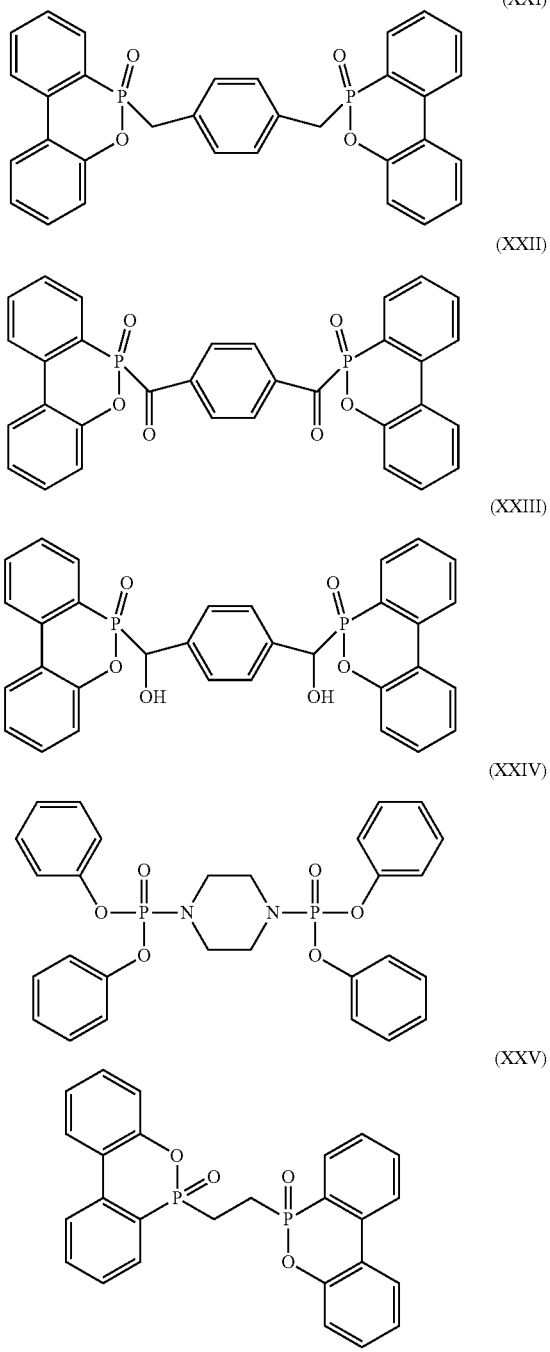

Figure 4:
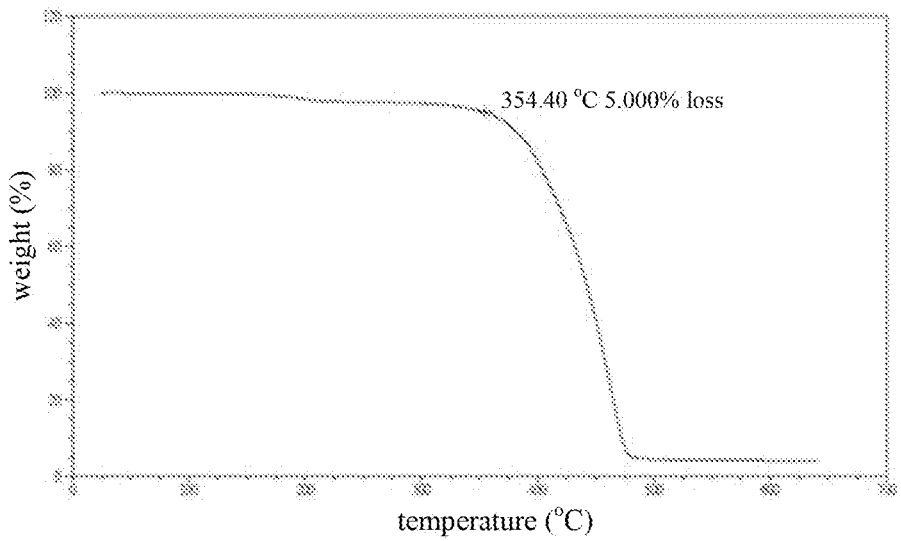
FIG. 4 illustrates the thermal decomposition temperature thermogram of compound of formula (IV)

Thermogravimetric analysis (TG or TGA) indicates that the white powder (compound of formula (IV)) has a thermal decomposition temperature (Td at 5% weight loss) 354.40° C., as shown in FIG. 4.

Figure 5:
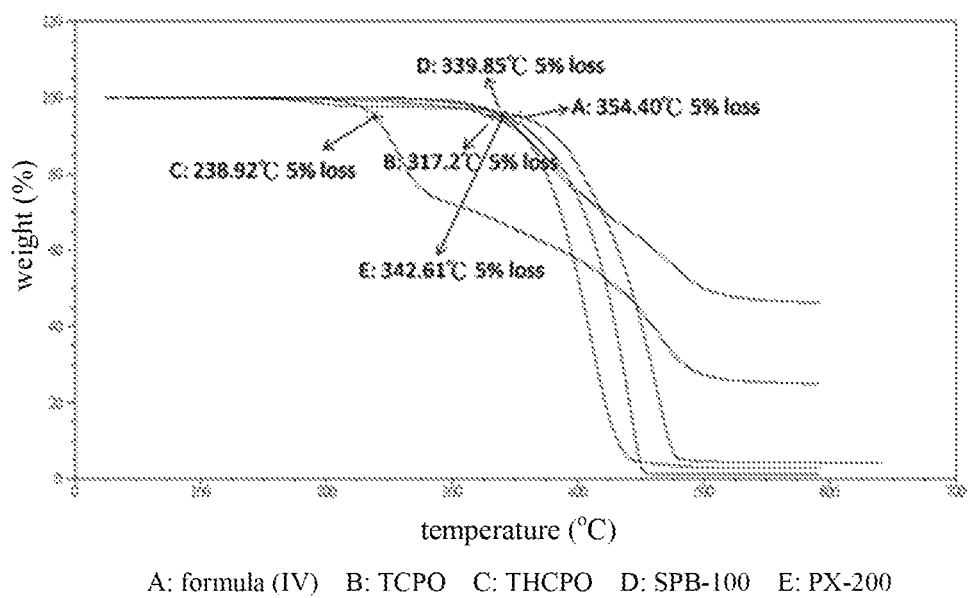
FIG. 5 contrasts the thermal decomposition temperature of compound of formula (IV) with other phosphorus-containing flame retardants.

Compared with commercial phosphorus-containing flame retardants, compound of formula (IV) of the present disclosure has a higher thermal decomposition temperature (curve A in FIG. 5). The phosphazene compound (D: SPB-100 in FIG. 5) has a thermal decomposition temperature Td (5% weight loss) of 339.85° C.; resorcinol bis[di(2,6-dimethylphenyl)phosphate] (E: PX-200 in FIG. 5) has a thermal decomposition temperature Td (5% weight loss) of 342.61° C.; di-DOPO phosphorus-containing high melting point flame retardant (TCPO) (B in FIG. 5, i.e., formula (XXII)) has a thermal decomposition temperature Td (5% weight loss) of 317.20° C.; di-DOPO phosphorus-containing high melting point flame retardant (THCPO) (C in FIG. 5, i.e., formula (XXIII)) has a thermal decomposition temperature Td (5% weight loss) of 238.92° C. In summary, the compound according to the present disclosure has a thermal decomposition temperature (5% weight loss) of 354.40° C. (A in FIG. 5, i.e., compound of formula (IV)), apparently higher than that of the conventional phosphorus-containing flame retardants, and has any one or more of improved stability, thermal resistance and anti-CAF (conductive anodic filament).

Compound of formula (IV) of the present disclosure has a phosphorus content of up to 13.78%. Conventional phosphorus-containing flame retardants have the following phosphorus content: DOPO has a phosphorus content of 14.3%; PX-200 has a phosphorus content of 9.0%; SPB-100 has a phosphorus content of 13.4%; SP-703 (formula (XXIV)) has a phosphorus content of 11.25%; aluminum phosphinate (OP-930) has a phosphorus content of 23% to 24%; and phosphorus-containing novolac resin (such as DOPO-bis-phenol A novolac resin XZ-92741) has a phosphorus content of about 8%. DOPO and SPB-100 with higher phosphorus content have low melting point and low thermal decomposition temperature, high tendency of ionization (conductive anodic filament) at high temperature, poor thermal stability and poor thermal resistance, such that laminates made therefrom have high coefficient of thermal expansion, easily causing cracking of internal layers during fabrication of circuit boards and deteriorating product quality; phosphorus-containing novolac resin has low phosphorus content and therefore fails to serve as the phosphorus-containing flame retardant alone in the resin to provide sufficient flame retardancy, thereby requiring other flame retardants, which makes the resin system too complicated to perform adjustment; SP-703 has low phosphorus content and easily broken C—N bond in the molecule and is therefore easily cracking, also having poor stability, poor thermal resistance, high coefficient of thermal expansion in laminates and high tendency of ionization (conductive anodic filament) at high temperature; OP-935 and OP-930, while having highest phosphorus content, due to the presence of aluminum (Al) ion, may cause ionization (conductive anodic filament) at high temperature and deteriorated dielectric constant; in sum, the compound of the present disclosure has the highest phosphorus content among all phosphorus-containing flame retardants not containing metal ions and is advantageous for improving flame retardancy and thermal resistance and laminate properties.

Preparation Example 4: Resin Composition Containing First Flame Retardant

According to the amount listed in Table 1 and 2, compounds obtained from preparation example 1 to preparation example 3 (e.g., formula (IV), formula (V) or formula (VI)) are individually well-mixed with one or more of reactive component, second flame retardant, inorganic filler, solvent and curing accelerator to obtain various resin compositions containing the compounds according to the present disclosure, i.e., Example 1 to Example 12 (hereinafter abbreviated as E1 to E12).

Preparation Example 5: Resin Composition not Containing First Flame Retardant

According to the amount listed in Table 3, different conventional flame retardants are well-mixed with one or more of reactive component, second flame retardant, inorganic filler, solvent and curing accelerator to obtain the resin compositions of Comparative Example 1 to Comparative Example 6 (hereinafter abbreviated as C1 to C6).

Raw materials below are used to prepare the resin compositions of various Examples and Comparative Examples of the present disclosure according to the amount listed in Table 1 to Table 3 and further fabricated to prepare test samples or articles.
1. Methacrylate-terminated polyphenylene ether resin: SA-9000, available from SABIC.
2. Vinylbenzyl-terminated biphenyl polyphenylene ether resin: OPE-2st, available from Mitsubishi Gas Chemical Co., Inc.
3. Bisphenol A cyanate ester resin: BA-230S, available from Lonza.
4. Cyanate ester resin: BTP-6020S, available from Lonza.
5. Polyphenylmethane maleimide: BMI-2300, available from Daiwakasei Industry Co. Ltd.
6. Bis(3-ethyl-5-methyl-4-maleimidophenyl)methane: BMI-70, available from K.I Chemical Industry Co., Ltd.
7. 2,5-dimethyl-2,5-di(tert-butylperoxy)-3-hexyne: 25B, commercially available from NOF Corporation.
8. Phosphazene: SPB-100, available from Otsuka Chemical Co. Ltd.
9. Resorcinol bis[di(2,6-dimethylphenyl)phosphate]: PX-200, available from Daihachi Chemical Industry Co. Ltd.
10. Fused silica: available from Sibelco.
11. Aluminum diethyl phosphinate (aluminum phosphinate): OP-935, available from Clariant.
12. DOPO-containing bisphenol A novolac curing agent: XZ-92741, available from Dow Chemical Company.
13. 9,10-dihydro-9-oxa-10-phosphaphenanthrene-10-oxide (DOPO): available from Sanko Co., Ltd.
14. Zinc octoate: available from Kingyorker Enterprise Co. Ltd.
15. Spherical silica: SC-2050SV, available from Admatechs.
16. DOPO-HQ resin: available from Chang Chun Plastics. Co. Ltd.
17. Di-DOPO phosphorus-containing high melting point flame retardant: synthesized by Applicant by reference to Chinese Patent Application Publication No. CN105936745A.

Results of Examples and Comparative Examples are listed in Table 1 to Table 3.

TABLE 1

Resin compositions of Examples (in part by weight) and test results

| Components | | | E1 | E2 | E3 | E4 | E5 | E6 |
|---|---|---|---|---|---|---|---|---|
| polyphenylene ether resin | vinylbenzyl-terminated biphenyl polyphenylene ether resin | OPE-2st | 70 | 70 | 70 | 70 | 70 | 70 |
| | methacrylate-terminated polyphenylene ether resin | SA-9000 | 30 | 30 | 30 | 30 | 30 | 30 |

TABLE 1-continued

Resin compositions of Examples (in part by weight) and test results

| | | | | | | | | |
|---|---|---|---|---|---|---|---|---|
| cyanate ester resin | bisphenol A cyanate ester resin | BA-230S | 5 | 5 | 5 | 5 | 5 | 5 |
| | cyanate ester resin | BTP-6020S | 5 | 5 | 5 | 5 | 5 | 5 |
| maleimide resin | phenylmethane maleimide polymer | BMI-2300 | 10 | 10 | 10 | 10 | 10 | 10 |
| | bis(3-ethyl-5-methyl-4-maleimide phenyl) methane | BMI-70 | 20 | 20 | 20 | 20 | 20 | 20 |
| first flame retardant | DOPO type first flame retardant | formula (IV) | 50 | — | — | 25 | 25 | — |
| | DPPO type first flame retardant | formula (V) | — | 50 | — | — | — | — |
| | phosphate type first flame retardant | formula (VI) | — | 50 | — | 25 | — | 25 |
| second flame retardant | aluminum phosphinate | OP-935 | — | — | — | — | — | — |
| | phosphazene compound | SPB-100 | — | — | — | — | — | — |
| | resorcinol bis[di(2,6-dimethylphenyl) phosphate] | PX-200 | — | — | — | — | — | — |
| | DOPO-containing bisphenol A novolac curing agent | XZ-92741 | — | — | — | — | — | — |
| inorganic filler | spherical silica | SC-2050SV | — | — | — | — | — | — |
| | fused silica | fused silica | 40 | 40 | 40 | 40 | 40 | 40 |
| solvent | methyl ethyl ketone | MEK | 30 | 30 | 30 | 30 | 30 | 30 |
| | toluene | toluene | 30 | 30 | 30 | 30 | 30 | 30 |
| curing accelerator | zinc octoate | | 0.03 | 0.03 | 0.03 | 0.03 | 0.03 | 0.03 |
| | 2,5-dimethyl-2,5-di(t-butylperoxy)-3-hexyne | 25B | 1 | 1 | 1 | 1 | 1 | 1 |

| property test | test item (method) | unit | E1 | E2 | E3 | E4 | E5 | E6 |
|---|---|---|---|---|---|---|---|---|
| glass transition temperature (Tg) | DMA | °C. | 220 | 218 | 217 | 220 | 219 | 217 |
| coefficient of thermal expansion (50-120° C.) | TMA (z-axis) | ppm/°C. | 40 | 40 | 41 | 40 | 40 | 41 |
| solder dip test | S/D | cycle | >20 | >20 | >20 | >20 | >20 | >20 |
| PCT test | 3 hours | NA | pass | pass | pass | pass | pass | pass |
| dielectric constant | dielectric constant at 10 GHz | NA | 3.60 | 3.60 | 3.61 | 3.60 | 3.60 | 3.60 |
| dissipation factor | dissipation factor at 10 GHz | NA | 0.0060 | 0.0060 | 0.0060 | 0.0061 | 0.0060 | 0.0060 |
| flame retardancy test | UL94 | NA | V-0 | V-0 | V-0 | V-0 | V-0 | V-0 |

TABLE 2

Resin compositions of Examples (in part by weight) and test results

| | Components | | E7 | E8 | E9 | E10 | E11 | E12 |
|---|---|---|---|---|---|---|---|---|
| polyphenylene ether resin | vinylbenzyl-terminated biphenyl polyphenylene ether resin | OPE-2st | 70 | 70 | 70 | 70 | 70 | 100 |
| | methacrylate-terminated polyphenylene ether resin | SA-9000 | 30 | 30 | 30 | 30 | 30 | — |
| cyanate ester resin | bisphenol A cyanate ester resin | BA-230S | 5 | 5 | 5 | 5 | 5 | — |
| | cyanate ester resin | BTP-6020S | 5 | 5 | 5 | 5 | 5 | — |
| maleimide resin | phenylmethane maleimide polymer | BMI-2300 | 10 | 10 | 10 | 10 | 10 | — |
| | bis(3-ethyl-5-methyl-4-maleimide phenyl) methane | BMI-70 | 20 | 20 | 20 | 20 | 20 | — |
| first flame retardant | DOPO type first flame retardant | formula (IV) | 55 | 30 | 30 | 30 | 30 | 25 |
| | DPPO type first flame retardant | formula (V) | — | — | — | — | — | — |
| | phosphate type first flame retardant | formula (VI) | — | — | — | — | — | — |
| | allyl phosphate type first flame retardant | formula (VII) | — | — | — | — | — | — |

TABLE 2-continued

Resin compositions of Examples (in part by weight) and test results

| | | | | | | | | |
|---|---|---|---|---|---|---|---|---|
| second flame retardant | aluminum phosphinate | OP-935 | — | 5 | — | — | — | — |
| | phosphazene compound | SPB-100 | — | — | 10 | — | — | — |
| | resorcinol bis[di(2,6-dimethylphenyl) phosphate] | PX-200 | — | — | — | 10 | — | — |
| | DOPO-containing bisphenol A novolac curing agent | XZ-92741 | — | — | — | — | 10 | — |
| inorganic filler | spherical silica | SC-2050SV | — | — | — | — | — | 70 |
| | fused silica | fused silica | 40 | 40 | 40 | 40 | 40 | — |
| solvent | methyl ethyl ketone | MEK | 30 | 30 | 30 | 30 | 30 | 30 |
| | toluene | toluene | 30 | 30 | 30 | 30 | 30 | 100 |
| curing accelerator | zinc octoate | | 0.03 | 0.03 | 0.03 | 0.03 | 0.03 | — |
| | 2,5-dimethyl-2,5-di(t-butylperoxy)-3-hexyne | 25B | 1 | 1 | 1 | 1 | 1 | 1 |

| property test | test item (method) | unit | E7 | E8 | E9 | E10 | E12 | E12 |
|---|---|---|---|---|---|---|---|---|
| glass transition temperature (Tg) | DMA | °C. | 220 | 215 | 218 | 210 | 220 | 210 |
| coefficient of thermal expansion (50-120° C.) | TMA (z-axis) | ppm/°C. | 41 | 43 | 41 | 43 | 40 | 35 |
| solder dip test | S/D | cycle | >20 | >20 | >20 | >20 | >20 | >20 |
| PCT test | 3 hours | NA | pass | pass | pass | pass | pass | pass |
| dielectric constant | dielectric constant at 10 GHz | NA | 3.61 | 3.60 | 3.62 | 3.60 | 3.63 | 3.60 |
| dissipation factor | dissipation factor at 10 GHz | NA | 0.0061 | 0.0062 | 0.0062 | 0.0058 | 0.0064 | 0.0058 |
| flame retardancy test | UL94 | NA | V-0 | V-0 | V-0 | V-0 | V-0 | V-0 |

TABLE 3

Resin compositions of Comparative Examples (in part by weight) and test results

| Components | | | C1 | C2 | C3 | C4 | C5 | C6 |
|---|---|---|---|---|---|---|---|---|
| polyphenylene ether resin | vinylbenzyl-terminated biphenyl polyphenylene ether resin | OPE-2st | 70 | 70 | 70 | 70 | 70 | 70 |
| | methacrylate-terminated polyphenylene ether resin | SA-9000 | 30 | 30 | 30 | 30 | 30 | 30 |
| cyanate ester resin | bisphenol A cyanate ester resin | BA-230S | 5 | 5 | 5 | 5 | 5 | 5 |
| | cyanate ester resin | BTP-6020S | 5 | 5 | 5 | 5 | 5 | 5 |
| maleimide resin | phenylmethane maleimide polymer | BMI-2300 | 10 | 10 | 10 | 10 | 10 | 10 |
| | bis(3-ethyl-5-methyl-4-maleimide phenyl) methane | BMI-70 | 20 | 20 | 20 | 20 | 20 | 20 |
| second flame retardant | aluminum phosphinate | OP-935 | 50 | — | — | — | — | — |
| | phosphazene compound | SPB-100 | — | 50 | — | — | — | — |
| | resorcinol bis[di(2,6-dimethylphenyl) phosphate] | PX-200 | — | — | 50 | — | — | — |
| | DOPO-containing bisphenol A novolac curing agent | XZ-92741 | — | — | — | 50 | — | — |
| | DOPO-HQ resin | DOPO-HQ | — | — | — | — | 50 | — |
| | di-DOPO phosphorus-containing high melting point flame retardant | Di-DOPO | — | — | — | — | — | 50 |
| inorganic filler | fused silica | fused silica | 40 | 40 | 40 | 40 | 40 | 40 |
| solvent | methyl ethyl ketone | MEK | 30 | 30 | 30 | 30 | 30 | 30 |
| | toluene | toluene | 30 | 30 | 30 | 30 | 30 | 30 |
| curing accelerator | zinc octoate | | 0.03 | 0.03 | 0.03 | 0.03 | 0.03 | 0.03 |
| | 2,5-dimethyl-2,5-di(t-butylperoxy)-3-hexyne | 25B | 1 | 1 | 1 | 1 | 1 | 1 |

TABLE 3-continued

Resin compositions of Comparative Examples (in part by weight) and test results

| property test | test item (method) | unit | C1 | C2 | C3 | C4 | C5 | C6 |
|---|---|---|---|---|---|---|---|---|
| glass transition temperature (Tg) | DMA | °C. | 185 | 200 | 190 | 210 | 200 | 213 |
| coefficient of thermal expansion (50-120° C.) | TMA (z-axis) | ppm/°C. | 55 | 50 | 53 | 45 | 50 | 50 |
| solder dip test | S/D | cycle | 5 | >20 | 15 | 18 | 10 | >20 |
| PCT test | 3 hours | NA | fail | pass | fail | fail | fail | pass |
| dielectric constant | dielectric constant at 10 GHz | NA | 3.70 | 3.75 | 3.61 | 3.75 | 3.76 | 3.60 |
| dissipation factor | dissipation factor at 10 GHz | NA | 0.0072 | 0.0075 | 0.0062 | 0.0080 | 0.0085 | 0.0061 |
| flame retardancy test | UL94 | NA | V-0 | V-0 | V-1 | V-1 | V-1 | V-0 |

Preparation of Specimens or Samples for Property Tests:

In the aforesaid property tests, resin compositions of E1 to E12 and C1 to C6 listed in the tables were well mixed in a stirred tank respectively and then placed in an impregnation tank, and fiberglass fabrics (2116 E-glass fiber fabrics, available from Asahi) were individually passed through the impregnation tank to impregnate the fiberglass fabrics with the resin compositions, followed by heating and baking at 120-160° C. to a semi-cured state to obtain prepregs useful for making the following specimens or samples.

1. Copper-Containing Laminate (Obtained by Laminating Five Prepregs)

Two pieces of 0.5 ounce (oz) (thickness of 18 pin) HTE (High Temperature Elongation) copper foil and five pieces of prepreg (2116 E-glass fiber fabric) obtained from each sample were prepared, wherein each prepreg has a resin content of about 55%. A copper foil, five prepregs and a copper foil were superimposed in such order and then subject to a vacuum condition for lamination at 195° C. for 2 hours to form each copper-clad laminate sample. In the sample, five superimposed prepregs were cured to form the insulation material layer between the two copper foils, wherein the insulation material layer has a resin content of about 55%.

2. Copper-Free Laminate (Obtained by Laminating Five Prepregs)

Each copper-containing laminate was etched to remove the two copper foils to obtain a copper-free laminate obtained by laminating five prepregs and having a resin content of about 55%.

3. Copper-Free Laminate (Obtained by Laminating Two Prepregs)

Two pieces of 0.5 ounce HTE copper foil and two pieces of prepreg (106 E-glass fiber fabric) obtained from each sample were prepared, wherein each prepreg has a resin content of about 70%. A copper foil, two prepregs and a copper foil were superimposed in such order and then subject to a vacuum condition for lamination at 195° C. for 2 hours to form each copper-clad laminate sample. Next, each copper-containing laminate was etched to remove the two copper foils to obtain a copper-free laminate obtained by laminating two prepregs and having a resin content of about 70%.

4. Copper-Free Laminate (Obtained by Laminating Eight Prepregs)

Two pieces of 0.5 ounce HTE copper foil and eight pieces of prepreg (7628 E-glass fiber fabric) obtained from each sample were prepared, wherein each prepreg has a resin content of about 45%. A copper foil, eight prepregs and a copper foil were superimposed in such order and then subject to a vacuum condition for lamination at 195° C. for 2 hours to form each copper-clad laminate sample. Next, each copper-containing laminate was etched to remove the two copper foils to obtain a copper-free laminate obtained by laminating eight prepregs and having a resin content of about 45%.

Each specimen was analyzed as described below.

1. Glass Transition Temperature (Tg)

The copper-free laminate (obtained by laminating five prepregs) specimen was subject to glass transition temperature measurement. A dynamic mechanical analyzer (DMA) was used by reference to IPC-TM-650 2.4.24.4 "Glass Transition and Modulus of Materials Used in High Density Interconnection (HDI) and Microvias-DMA Method" to measure each specimen.

2. Coefficient of Thermal Expansion (CTE z-Axis)

The copper-free laminate (obtained by laminating five prepregs) specimen was subject to coefficient of thermal expansion measurement. A thermomechanical analyzer (TMA) was used for measurement (unit: ppm/° C.) by reference to IPC-TM-650 2.4.24.5 at a temperature range from 50° C. to 120° C. Lower coefficient of thermal expansion represents lower expansion under heating, indicating the resin composition may have a better property when being used for a printed circuit board.

3. Solder Dip Test (S/D)

The copper-clad laminate (obtained by laminating five prepregs) specimen was used in the solder dip test. The copper-clad laminate specimen was soaked in a 288° C. solder bath for 10 seconds as one cycle, removed and placed under room temperature for about 10 seconds, and then soaked in the solder bath for 10 seconds, removed and placed under room temperature for about 10 seconds. The processes were repeated to measure the total cycles before the specimen occurs delamination. Greater number of total cycles before delamination in the solder dip test indicates that the article made from the resin composition (e.g., copper-clad laminate) has better thermal resistance.

4. Thermal Resistance after Moisture Absorption (121° C./100% Relative Humidity/3 Hours)

The copper-free laminate specimen (obtained by laminating five prepregs) was subject to pressure cooking test (PCT) by reference to IPC-TM-650 2.6.16.1, before which the specimen was subject to moisture absorption for 3 hours (relative humidity 100%) and then soaked in a 288° C. solder bath for 20 seconds, removed and inspected for the existence of delamination, which represents fail, such as whether interlayer delamination (i.e., blistering and separation between any layers) occurs between insulation layers.

5. Dielectric Constant (Dk) and Dissipation Factor (Df)

In dielectric constant and dissipation factor measurement, the copper-free laminate (obtained by laminating two prepregs) was tested by using a microwave dielectrometer available from AET Corp. by reference to JIS C2565 "Measuring methods for ferrite cores for microwave device" at 10 GHz for analyzing each specimen. Lower dielectric constant and lower dissipation factor represent better dielectric properties of the specimen. A difference in Dk of greater than 0.05 represents a significant difference in dielectric constant in different laminates. A difference in Df of greater than 0.0005 represents a significant difference in dissipation factor in different laminates.

6. Flame Resistance

In the flame retardancy test, a 125 mm×13 mm copper-free laminate specimen (obtained by laminating eight prepregs) was measured in accordance with the UL94 rating to evaluate flame retardancy level represented by V-0, V-1, or V-2, wherein V-0 indicates a superior flame retardancy to V-1, V-1 indicates a superior flame retardancy to V-2, and burn-out is the worst.

Test results of E1 to E12 resin compositions containing the first flame retardant are shown by Table 1 and Table 2; test results of C1 to C6 resin compositions are shown by Table 3.

Based on the test results from Table 1 to Table 3, it is apparent that specimens containing the compounds according to the present disclosure as the first flame retardant (E1 to E12 compared with C1 to C6) have better flame retardancy. More surprisingly, the resin compositions of the present disclosure have improved one or more aspects in glass transition temperature, coefficient of thermal expansion, thermal resistance, flame retardancy, dielectric constant, and dissipation factor.

The above detailed description is merely illustrative in nature and is not intended to limit the embodiments of the subject matter or the application and uses of such embodiments. As used herein, the term "exemplary" means "serving as an example, instance, or illustration." Any implementation described herein as exemplary is not necessarily to be construed as preferred or advantageous over other implementations.

Moreover, while at least one exemplary example or comparative example has been presented in the foregoing detailed description, it should be appreciated that a vast number of variations exist. It should also be appreciated that the exemplary one or more embodiments described herein are not intended to limit the scope, applicability, or configuration of the claimed subject matter in any way. Rather, the foregoing detailed description will provide those skilled in the art with a convenient guide for implementing the described one or more embodiments. Also, the scope defined by the claims includes known equivalents and foreseeable equivalents at the time of filing this patent application.

What is claimed is:

1. A compound having a structure represented by the following formula (I):

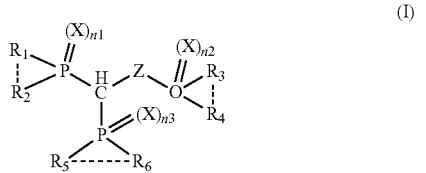

(I)

wherein n1, n2 and n3 are each individually 1;
X and Z are each individually oxygen or sulfur;
dotted line represents presence or absence of a bond; and
$R_1$, $R_2$, $R_3$, $R_4$, $R_5$ and $R_6$ are each individually $C_6$-$C_{18}$ aryl or $C_6$-$C_{18}$ alkoxy.

2. The compound of claim 1, which is represented by the following formula (II):

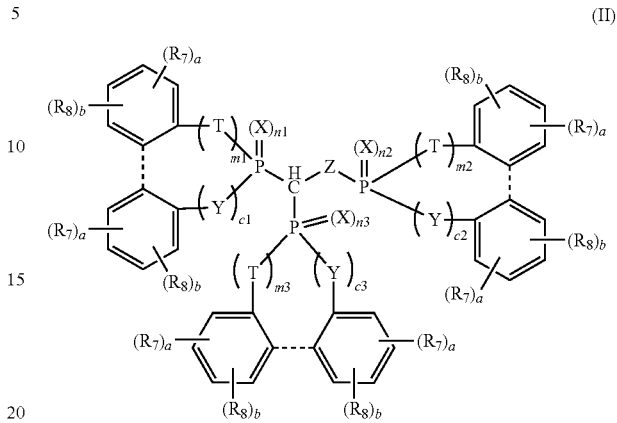

(II)

wherein n1, n2 and n3 are each individually 1, and m1, m2, m3, c1, c2 and c3 are each individually 0 or 1;

X, Y, Z and T are each individually oxygen or sulfur;

dotted line represents presence or absence of a bond, and when the dotted line represents presence of a bond, m1 and c1 are not both 1 at the same time, m2 and c2 are not both 1 at the same time, or m3 and c3 are not both 1 at the same time;

$R_7$ and $R_8$ are each individually hydrogen or $C_1$-$C_6$ alkyl; and a and b are each individually an integer of 1 to 3, and a+b≤5.

3. The compound of claim 1, which is represented by the following formula (III):

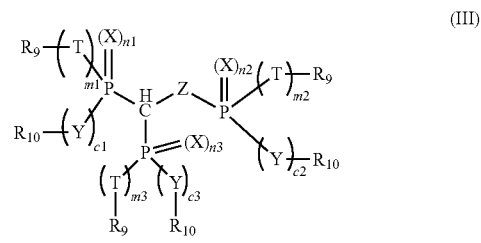

(III)

wherein n1, n2 and n3 are each individually 1, m1, m2, m3, c1, c2 and c3 are each individually 0 or 1, and m1 and c1, m2 and c2, or m3 and c3 are both 0 or 1;

X, Y, Z and T are each individually oxygen or sulfur; and $R_9$ and $R_{10}$ are each individually $C_6$-$C_{18}$ aryl or $C_6$-$C_{18}$ aryloxy, with the proviso that when m1 and c1, m2 and c2, or m3 and c3 are both 1, $R_9$ and $R_{10}$ are not aryloxy.

4. The compound of claim 1, which is represented by any one of the following formula (IV) to formula (VI):

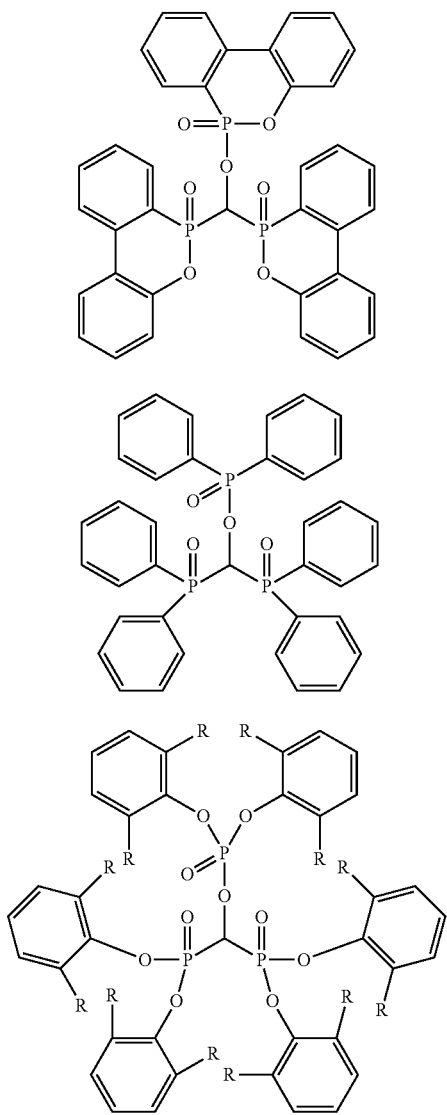

wherein R represents hydrogen, methyl or isopropyl.

5. A method of preparing the compound of claim 1, comprising a step of reacting a phosphorus-containing compound with triphosgene or phosgene.

6. The method of claim 5, wherein the phosphorus-containing compound is represented by the following formula (VII):

wherein n is 1;
X is oxygen or sulfur;
dotted line represents presence or absence of a bond;
$R_{11}$ and $R_{12}$ are each individually $C_6$-$C_{18}$ aryl or $C_6$-$C_{18}$ aryloxy; and
$R_{23}$ represents hydrogen or siloxanyl.

7. A resin composition, comprising 1 to 100 parts by weight of the compound of claim 1 serving as a first flame retardant and 100 parts by weight of a reactive component.

8. The resin composition of claim 7, wherein the first flame retardant and the reactive component are present in a weight ratio of between 1:2 and 1:20.

9. The resin composition of claim 7, further comprising at least one of a second flame retardant, inorganic filler, dispersing agent, antioxidant, toughening agent, silane coupling agent, solvent and curing accelerator.

10. The resin composition of claim 7, wherein the reactive component comprises epoxy resin, phenolic resin, isocyanate resin, cyanate ester resin, benzoxazine resin, anhydride, polyester, maleimide resin, polyphenylene ether resin, amine curing agent, phenoxy resin, small molecule vinyl compound, polyamide, polyimide, polyolefin or a combination thereof.

11. An article made from the resin composition of claim 7, comprising a prepreg, a resin film, a resin film with copper foil, a laminate or a printed circuit board.

* * * * *